United States Patent
Ootsuka et al.

(10) Patent No.: US 9,653,771 B2
(45) Date of Patent: May 16, 2017

(54) DIRECTIONAL COUPLER

(71) Applicant: TDK CORPORATION, Tokyo (JP)

(72) Inventors: Noriaki Ootsuka, Tokyo (JP); Takeshi Kijima, Tokyo (JP); Yasunori Sakisaka, Tokyo (JP); Yuta Ashida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 14 days.

(21) Appl. No.: 14/969,368

(22) Filed: Dec. 15, 2015

(65) Prior Publication Data

US 2016/0218410 A1    Jul. 28, 2016

(30) Foreign Application Priority Data

Jan. 27, 2015   (JP) ................... 2015-013598

(51) Int. Cl.
*H01P 5/18*   (2006.01)
*H03H 7/38*   (2006.01)

(52) U.S. Cl.
CPC .............. *H01P 5/184* (2013.01); *H01P 5/185* (2013.01); *H01P 5/187* (2013.01); *H03H 7/383* (2013.01)

(58) Field of Classification Search
CPC .................................. H01P 5/18; H03H 7/38
USPC .......................................... 333/109–112, 116
See application file for complete search history.

(56) References Cited

U.S. PATENT DOCUMENTS

| | | | |
|---|---|---|---|
| 4,211,986 A | 7/1980 | Tajima | |
| 9,077,061 B2* | 7/2015 | Tamaru | H01P 5/184 |
| 9,385,411 B2* | 7/2016 | Ohashi | H01P 5/187 |
| 9,391,354 B2* | 7/2016 | Ootsuka | H01P 5/185 |
| 9,503,044 B2* | 11/2016 | Hashimoto | H01F 38/14 |
| 9,543,632 B2* | 1/2017 | Katabuchi | H01P 5/184 |
| 2002/0186088 A1 | 12/2002 | Ohta et al. | |
| 2012/0319797 A1 | 12/2012 | Tamaru | |
| 2013/0300518 A1* | 11/2013 | Tamaru | H01P 5/18 333/109 |
| 2017/0033428 A1* | 2/2017 | Ootsuka | H03H 7/38 |
| 2017/0040661 A1* | 2/2017 | Ashida | H01P 5/18 |

FOREIGN PATENT DOCUMENTS

| | | |
|---|---|---|
| JP | S54023447 A | 2/1979 |
| JP | 2001-077602 A | 3/2001 |
| JP | 2002-368553 A | 12/2002 |
| JP | 2006-222607 A | 8/2006 |
| JP | 2009-200574 A | 9/2009 |
| JP | 2013-005076 A | 1/2013 |
| JP | 2014-057207 A | 3/2014 |

* cited by examiner

*Primary Examiner* — Dean Takaoka

(74) *Attorney, Agent, or Firm* — Oliff PLC

(57) ABSTRACT

A directional coupler includes: a main line connecting an input port and an output port; first to third subline sections each of which is formed of a line configured to be electromagnetically coupled to the main line; a first matching section provided between the first subline section and the second subline section; and a second matching section provided between the second subline section and the third subline section. The first and second matching sections are configured to cause changes in phase of high frequency signals passing therethrough, and have mutually different characteristics so as to create two attenuation poles in the frequency response of the coupling of the directional coupler.

7 Claims, 15 Drawing Sheets

DIRECTIONAL COUPLER

BACKGROUND OF THE INVENTION

1. Field of the Invention

The present invention relates to a wideband capable directional coupler.

2. Description of the Related Art

Directional couplers are used for detecting the levels of transmission/reception signals in transmission/reception circuits of wireless communication apparatuses such as cellular phones and wireless LAN communication apparatuses.

A directional coupler configured as follows is known as a conventional directional coupler. The directional coupler has an input port, an output port, a coupling port, a terminal port, a main line, and a subline. One end of the main line is connected to the input port, and the other end of the main line is connected to the output port. One end of the subline is connected to the coupling port, and the other end of the subline is connected to the terminal port. The main line and the subline are configured to be electromagnetically coupled to each other. The terminal port is grounded via a terminator having a resistance of 50Ω, for example. The input port receives a high frequency signal, and the output port outputs the same. The coupling port outputs a coupling signal having a power that depends on the power of the high frequency signal received at the input port.

Major parameters indicating the characteristics of directional couplers include insertion loss, coupling, isolation, directivity, and return loss at the coupling port. Definitions of these parameters will now be described. First, assume that the input port receives a high frequency signal of power P1. In this case, let P2 be the power of the signal output from the output port, P3 be the power of the signal output from the coupling port, and P4 be the power of the signal output from the terminal port. Assuming that the output port receives a high frequency signal of power P02, let P03 be the power of the signal output from the coupling port. Assuming that the coupling port receives a high frequency signal of power P5, let P6 be the power of the signal reflected at the coupling port. Further, let IL represent insertion loss, C represent coupling, I represent isolation, D represent directivity, and RL represent return loss at the coupling port. These parameters are defined by the following equations.

$IL=10 \log(P2/P1) [dB]$ $C=10 \log(P3/P1) [dB]$ $I=10 \log(P03/P02) [dB]$ $D=10 \log(P4/P3) [dB]$ $RL=10 \log(P6/P5) [dB]$ The coupling of the conventional directional coupler increases with increasing frequency of the high frequency signal received at the input port. The conventional directional coupler thus suffers from the problem that the frequency response of the coupling is not flat. Where coupling is denoted as −c (dB), an increase in coupling means a decrease in the value of c.

Mobile communication systems conforming to the Long Term Evolution (LTE) standard have become practically used in recent years, and further, practical use of mobile communication systems conforming to the LTE-Advanced standard, which is an evolution of the LTE standard, is under study. Carrier Aggregation (CA) is one of the key technologies of the LTE-Advanced standard. CA uses multiple carriers called component carriers simultaneously to enable wideband transmission.

A mobile communication apparatus operable under CA uses multiple frequency bands simultaneously. Accordingly, such a mobile communication apparatus requires a wideband capable directional coupler, that is, a directional coupler usable for multiple signals in multiple frequency bands.

JP 2014-057207A discloses a wideband capable directional coupler. In the directional coupler disclosed in JP 2014-057207A, the subline includes a first coupling section having strong coupling to the main line, a second coupling section having weak coupling to the main line and located closer to the coupling port than the first coupling section, a third coupling section having weak coupling to the main line and located closer to the isolation port (terminal port) than the first coupling section, a first non-coupling section not coupled to the main line, extending between the first and second coupling sections and having a length of a quarter or more of a wavelength corresponding to the service frequency band, and a second non-coupling section not coupled to the main line, extending between the first and third coupling sections and having a length of a quarter or more of the wavelength corresponding to the service frequency band.

For the directional coupler disclosed in JP 2014-057207A, one attenuation pole occurs in the frequency response of the coupling. This allows a reduction in a change in coupling in response to a change in frequency over a somewhat wide frequency band. According to the frequency response of the coupling of this directional coupler, however, the coupling increases with increasing frequency in a frequency band higher than the frequency at which the attenuation pole occurs. It is thus difficult for this directional coupler to reduce a change in coupling in response to a change in frequency over a wider frequency band.

OBJECT AND SUMMARY OF THE INVENTION

It is an object of the present invention to provide a directional coupler achieving such a frequency response of the coupling that a change in coupling in response to a change in frequency is reduced over a wider frequency band when compared with a frequency response of a coupling in which one attenuation pole occurs.

A directional coupler of the present invention includes an input port, an output port, a coupling port, a terminal port, a main line connecting the input port and the output port, a first, a second and a third subline section each of which is formed of a line configured to be electromagnetically coupled to the main line, and a first and a second matching section.

The first to third subline sections and the first and second matching sections each have a first end and a second end opposite to each other. The first end of the first subline section is connected to the coupling port. The first end of the first matching section is connected to the second end of the first subline section. The first end of the second subline section is connected to the second end of the first matching section. The first end of the second matching section is connected to the second end of the second subline section. The first end of the third subline section is connected to the second end of the second matching section. The second end of the third subline section is connected to the terminal port.

The first matching section and the second matching section are configured to cause changes in phase of high frequency signals passing therethrough, and have mutually different characteristics so as to create two attenuation poles in the frequency response of the coupling of the directional coupler.

In the directional coupler of the present invention, the strength of coupling of the second subline section to the main line may be higher than the strength of coupling of the first subline section to the main line and the strength of coupling of the third subline section to the main line.

In the directional coupler of the present invention, each of the first and second matching sections may include a first path connecting the first end and the second end of the matching section, and a second path connecting the first path and the ground. The first path includes a first inductor. The second path includes a first capacitor and a second inductor connected in series.

In the directional coupler of the present invention, when each of the first and second matching sections includes the first path and the second path, the first inductor may have a first end and a second end opposite to each other, and the second inductor may have a first end and a second end, the first end being closest to the first path in terms of circuitry, the second end being closest to the ground in terms of circuitry. The first capacitor may be provided between the first end of the first inductor and the first end of the second inductor. In this case, the second path may further include a second capacitor provided between the second end of the first inductor and the first end of the second inductor.

In the directional coupler of the present invention, when each of the first and second matching sections includes the first path and the second path, the first path may further include a third inductor connected to the first inductor in series. In this case, the second inductor may have a first end and a second end, the first end being closest to the first path in terms of circuitry, the second end being closest to the ground in terms of circuitry. The first capacitor may be provided between the first end of the second inductor and the connection point between the first inductor and the third inductor.

In the directional coupler of the present invention, when each of the first and second matching sections includes the first path and the second path, the second inductor may have an inductance of 0.1 nH or higher.

In the directional coupler of the present invention, each of the first matching section and the second matching section may be a line.

According to the directional coupler of the present invention, two attenuation poles occur in the frequency response of the coupling. The directional coupler of the present invention thus achieves such a frequency response of the coupling that a change in coupling in response to a change in frequency is reduced over a wider frequency band when compared with a frequency response of a coupling in which one attenuation pole occurs.

Other and further objects, features and advantages of the invention will appear more fully from the following description.

DETAILED DESCRIPTION OF THE PREFERRED EMBODIMENTS

First Embodiment

Figure 1:
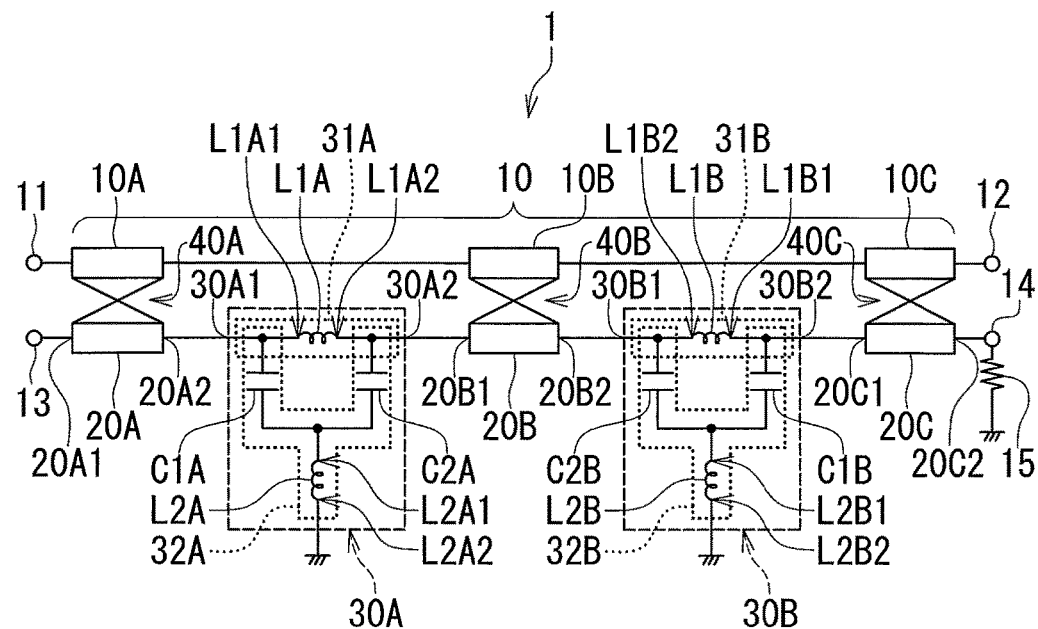
FIG. 1 is a circuit diagram illustrating the circuitry of a directional coupler according to a first embodiment of the invention.

Preferred embodiments of the present invention will now be described in detail with reference to the drawings. First, reference is made to FIG. 1 to describe the circuitry of a directional coupler according to a first embodiment of the invention. As shown in FIG. 1, the directional coupler 1 according to the first embodiment includes an input port 11, an output port 12, a coupling port 13, and a terminal port 14. The directional coupler 1 further includes a main line 10, a first subline section 20A, a second subline section 20B, a third subline section 20C, a first matching section 30A, and a second matching section 30B. The main line 10 connects the input port 11 and the output port 12. Each of the first to third subline sections 20A, 20B and 20C is formed of a line configured to be electromagnetically coupled to the main line 10. The terminal port 14 is grounded via a terminator 15 having a resistance of, for example, 50Ω.

The first subline section 20A has a first end 20A1 and a second end 20A2 opposite to each other. The second subline section 20B has a first end 20B1 and a second end 20B2 opposite to each other. The third subline section 20C has a first end 20C1 and a second end 20C2 opposite to each other. The first matching section 30A has a first end 30A1 and a second end 30A2 opposite to each other. The second matching section 30B has a first end 30B1 and a second end 30B2 opposite to each other.

The first end 20A1 of the first subline section 20A is connected to the coupling port 13. The first end 30A1 of the first matching section 30A is connected to the second end 20A2 of the first subline section 20A. The first end 20B1 of the second subline section 20B is connected to the second end 30A2 of the first matching section 30A. The first end 30B1 of the second matching section 30B is connected to the second end 20B2 of the second subline section 20B. The first end 20C1 of the third subline section 20C is connected to the second end 30B2 of the second matching section 30B. The second end 20C2 of the third subline section 20C is connected to the terminal port 14.

The first matching section 30A includes a first path 31A connecting the first end 30A1 and the second end 30A2, and a second path 32A connecting the first path 31A and the ground. The first path 31A includes a first inductor L1A. The first inductor L1A has a first end L1A1 and a second end L1A2 opposite to each other. Here, of the two ends of the first inductor L1A, the first end L1A1 is taken as the end closer to the first subline section 20A, whereas the second end L1A2 is taken as the end closer to the second subline section 20B.

The second path 32A includes a first capacitor C1A and a second inductor L2A connected in series. The second inductor L2A has a first end L2A1 and a second end L2A2. In terms of circuitry, the first end L2A1 is closest to the first path 31A, and the second end L2A2 is closest to the ground. The first capacitor C1A is provided between the first end L1A1 of the first inductor L1A and the first end L2A1 of the second inductor L2A. In the first embodiment, the second path 32A further includes a second capacitor C2A provided between the second end L1A2 of the first inductor L1A and the first end L2A1 of the second inductor L2A. The second inductor L2A has an inductance of 0.1 nH or higher. The inductance of the second inductor L2A is preferably not higher than 7 nH.

FIG. 1 illustrates an example in which the first capacitor C1A is provided between the first end L1A1 of the first inductor L1A and the first end L2A1 of the second inductor L2A, and the second capacitor C2A is provided between the second end L1A2 of the first inductor L1A and the first end L2A1 of the second inductor L2A. Alternatively, the first capacitor C1A may be provided between the second end L1A2 of the first inductor L1A and the first end L2A1 of the second inductor L2A, and the second capacitor C2A may be provided between the first end L1A1 of the first inductor L1A and the first end L2A1 of the second inductor L2A.

The second matching section 30B includes a first path 31B connecting the first end 30B1 and the second end 30B2, and a second path 32B connecting the first path 31B and the ground. The first path 31B includes a first inductor L1B. The first inductor L1B has a first end L1B1 and a second end L1B2 opposite to each other. Here, of the two ends of the first inductor L1B, the first end L1B1 is taken as the end closer to the third subline section 20C, whereas the second end L1B2 is taken as the end closer to the second subline section 20B.

The second path 32B includes a first capacitor C1B and a second inductor L2B connected in series. The second inductor L2B has a first end L2B1 and a second end L2B2. In terms of circuitry, the first end L2B1 is closest to the first path 31B, and the second end L2B2 is closest to the ground. The first capacitor C1B is provided between the first end L1B1 of the first inductor L1B and the first end L2B1 of the second inductor L2B. In the first embodiment, the second path 32B further includes a second capacitor C2B provided between the second end L1B2 of the first inductor L1B and the first end L2B1 of the second inductor L2B. The second inductor L2B has an inductance of 0.1 nH or higher. The inductance of the second inductor L2B is preferably not higher than 7 nH.

FIG. 1 illustrates an example in which the first capacitor C1B is provided between the first end L1B1 of the first inductor L1B and the first end L2B1 of the second inductor L2B, and the second capacitor C2B is provided between the second end L1B2 of the first inductor L1B and the first end L2B1 of the second inductor L2B. Alternatively, the first capacitor C1B may be provided between the second end L1B2 of the first inductor L1B and the first end L2B1 of the second inductor L2B, and the second capacitor C2B may be provided between the first end L1B1 of the first inductor L1B and the first end L2B1 of the second inductor L2B.

The main line 10 includes a first portion 10A to be electromagnetically coupled to the first subline section 20A, a second portion 10B to be electromagnetically coupled to the second subline section 20B, and a third portion 10C to be electromagnetically coupled to the third subline section 20C. Here, a portion of the main line 10 to be coupled to the first subline section 20A, i.e., the first portion 10A, and the first subline section 20A in combination will be referred to as the first coupling section 40A. A portion of the main line 10 to be coupled to the second subline section 20B, i.e., the second portion 10B, and the second subline section 20B in combination will be referred to as the second coupling section 40B. A portion of the main line 10 to be coupled to the third subline section 20C, i.e., the third portion 10C, and the third subline section 20C in combination will be referred to as the third coupling section 40C.

The strength of coupling of the first subline section 20A to the first portion 10A of the main line 10 will be referred to as the coupling of the first coupling section 40A alone. The strength of coupling of the second subline section 20B to the second portion 10B of the main line 10 will be referred to as the coupling of the second coupling section 40B alone. The strength of coupling of the third subline section 20C to the third portion 10C of the main line 10 will be referred to as the coupling of the third coupling section 40C alone. The coupling of the second coupling section 40B alone may be higher than the coupling of the first coupling section 40A alone and the coupling of the third coupling section 40C alone.

Each of the first and second matching sections 30A and 30B is a circuit for performing impedance matching between a signal source and a load, assuming a situation in which the terminal port 14 is grounded via the terminator 15 serving as the load, and the coupling port 13 is connected with the signal source having an output impedance equal to the resistance of the terminator 15 (e.g., 50Ω). On the assumption of the above situation, the first and second matching sections 30A and 30B are each designed so that the reflection coefficient as viewed in the direction from the coupling port 13 to the terminal port 14 has an absolute value of zero or near zero in the service frequency band of the directional coupler 1.

The first matching section 30A and the second matching section 30B are configured to cause changes in phase of high frequency signals passing therethrough, and have mutually different characteristics so that first and second attenuation poles occur at first and second frequencies different from each other in the frequency response of the coupling of the directional coupler 1. The mutually different characteristics of the first and second matching sections 30A and 30B specifically mean that the loci representing impedance changes of the matching sections 30A and 30B as a function of frequency on a Smith chart are different between the matching sections 30A and 30B. The first matching section 30A causes a phase change of 180° or around 180°, specifically in the range of 135° to 225°, in a signal having the first frequency at which the first attenuation pole occurs. The second matching section 30B causes a phase change of 180° or around 180°, specifically in the range of 135° to 225°, in a signal having the second frequency at which the second attenuation pole occurs.

The operation and effects of the directional coupler 1 according to the first embodiment will now be described. A high frequency signal is received at the input port 11 and output from the output port 12. The coupling port 13 outputs a coupling signal having a power that depends on the power of the high frequency signal received at the input port 11.

A first, a second and a third signal path are formed between the input port 11 and the coupling port 13. The first signal path passes through the first coupling section 40A. The second signal path passes through the second coupling section 40B and the first matching section 30A. The third signal path passes through the third coupling section 40C, the second matching section 30B and the first matching section 30A. When a high frequency signal has been received at the input port 11, the coupling signal to be output from the coupling port 13 is a signal resulting from a combination of a signal having passed through the first signal path, a signal having passed through the second signal path, and a signal having passed through the third signal path. The coupling of the directional coupler 1 depends on the coupling of each of the first, the second and the third coupling section 40A, 40B and 40C alone and the relationship among the phases of the signal having passed through the first signal path, the signal having passed through the second signal path, and the signal having passed through the third signal path.

On the other hand, a fourth, a fifth and a sixth signal path are formed between the output port 12 and the coupling port 13. The fourth signal path passes through the first coupling section 40A. The fifth signal path passes through the second coupling section 40B and the first matching section 30A. The sixth signal path passes through the third coupling section 40C, the second matching section 30B and the first matching section 30A. The isolation of the directional coupler 1 depends on the coupling of each of the first, the second and the third coupling section 40A, 40B and 40C alone and the relationship among the phases of the signal having passed through the fourth signal path, the signal having passed through the fifth signal path, and the signal having passed through the sixth signal path.

The directional coupler 1 according to the first embodiment is able to reduce a change in the coupling of the directional coupler 1 in response to a change in the frequency of a high frequency signal received at the directional coupler 1. This will be described in detail below.

The coupling of each of the first to third coupling sections 40A, 40B and 40C alone increases with increasing frequency of the high frequency signal received at the directional coupler 1. In this case, given a fixed amount of change in the phase of a signal when passing through each of the first and second matching sections 30A and 30B, a change in the frequency of the high frequency signal received at the directional coupler 1 causes a change in the power of the coupling signal.

On the other hand, the amount of change in the phase of a signal when passing through each of the first and second matching sections 30A and 30B varies depending on the frequency of the high frequency signal received at the directional coupler 1, that is, the frequency of the signal passing through each of the first and second matching sections 30A and 30B. In this case, given a fixed coupling of each of the first to third coupling sections 40A, 40B and 40C alone, a change in the frequency of the high frequency signal received at the directional coupler 1 causes a change in the power of the coupling signal.

The first and second matching sections 30A and 30B are designed so that in the service frequency band of the directional coupler 1, a change in power of the coupling signal is smaller than in the case with a fixed amount of change in the phase of a signal when passing through each of the first and second matching sections 30A and 30B. This allows the directional coupler 1 to be capable of reducing a change in the coupling of the directional coupler 1 in response to a change in the frequency of the high frequency signal received at the directional coupler 1.

According to the first embodiment, since the first matching section 30A and the second matching section 30B have mutually different characteristics as described previously, the first and second attenuation poles occur at the first and second frequencies different from each other in the frequency response of the coupling of the directional coupler 1. This makes it possible for the directional coupler 1 to achieve such a frequency response of the coupling that a change in coupling in response to a change in frequency is reduced over a wider frequency band when compared with a frequency response of a coupling in which one attenuation pole occurs. This advantageous effect will be described in more detail later. The first frequency and the second frequency may each be within or outside the service frequency band of the directional coupler 1.

Figure 2:
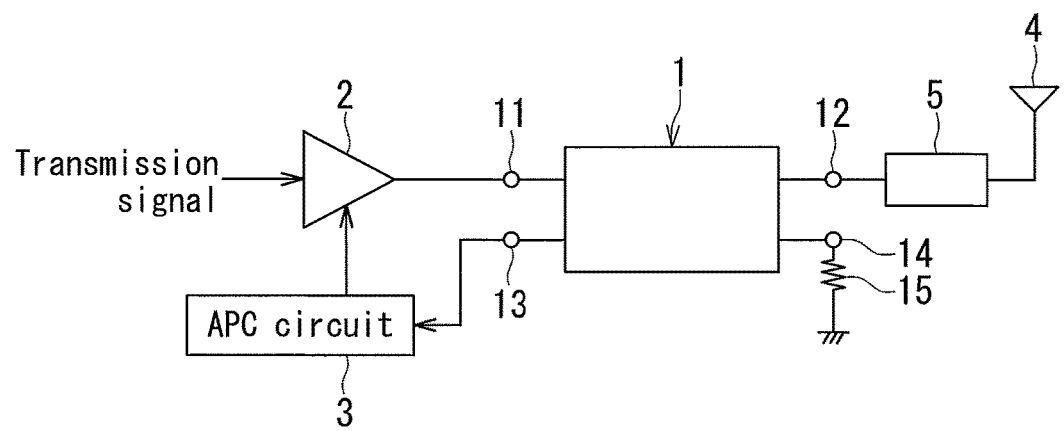
FIG. 2 is a circuit diagram illustrating an example of use of the directional coupler according to the first embodiment of the invention.

An example of use of the directional coupler 1 will now be described with reference to FIG. 2. FIG. 2 is a circuit diagram illustrating an example of use of the directional coupler 1. FIG. 2 illustrates a transmission circuit including the directional coupler 1. The transmission circuit shown in FIG. 2 includes a power amplifier 2, an automatic power control (APC) circuit 3 and an impedance matching element 5, in addition to the directional coupler 1.

The power amplifier 2 has an input, an output, and a gain control end. The input of the power amplifier 2 receives a transmission signal, which is a high frequency signal. The output of the power amplifier 2 is connected to the input port 11 of the directional coupler 1.

The APC circuit 3 has an input and an output. The input of the APC circuit 3 is connected to the coupling port 13 of the directional coupler 1. The output of the APC circuit 3 is connected to the gain control end of the power amplifier 2.

The output port 12 of the directional coupler 1 is connected to an antenna 4 via the impedance matching element 5. The impedance matching element 5 is an element for performing impedance matching between the transmission circuit and the antenna 4 in order to sufficiently reduce the level of a reflected wave signal resulting from the transmission signal reflected at the antenna 4. The terminal port 14 of the directional coupler 1 is grounded via the terminator 15.

In the transmission circuit shown in FIG. 2, the transmission signal amplified by the power amplifier 2 is received at the input port 11 of the directional coupler 1 and output from the output port 12 of the directional coupler 1. The coupling port 13 of the directional coupler 1 outputs a coupling signal having a power that depends on the level of the transmission signal received at the input port 11. The transmission signal output from the output port 12 goes through the impedance matching element 5 and is emitted from the antenna 4. The coupling signal output from the coupling port 13 is received at the APC circuit 3. In accordance with the level of the coupling signal output from the coupling port 13, the APC circuit 3 controls the gain of the power amplifier 2 so that the power amplifier 2 provides an output signal of approximately constant level.

Figure 3:
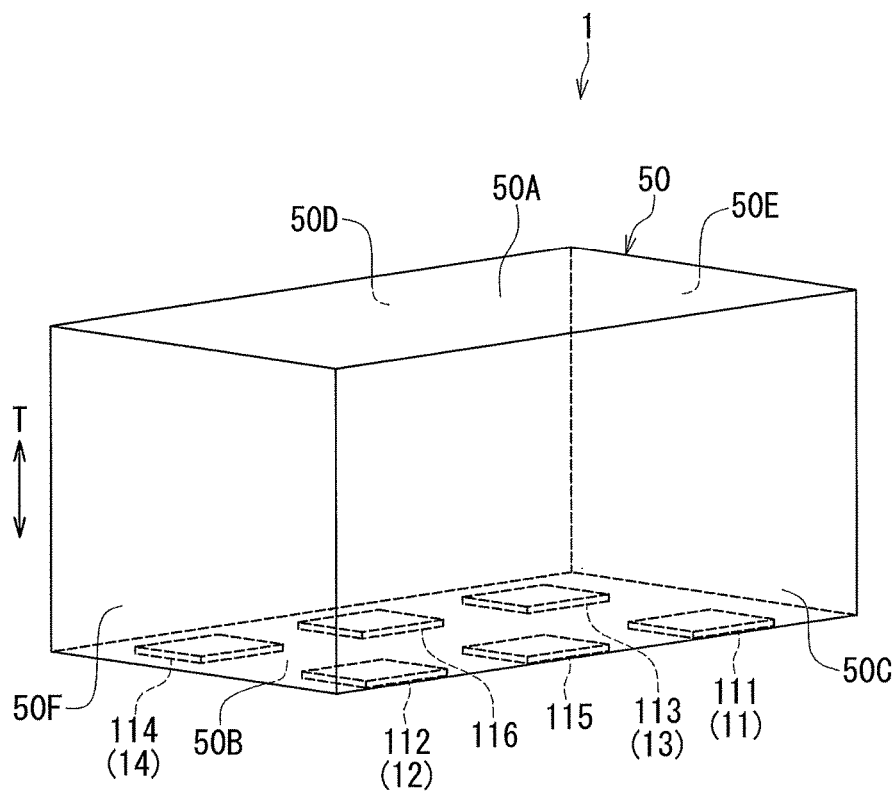
FIG. 3 is a perspective view of the directional coupler according to the first embodiment of the invention.

An example of the structure of the directional coupler 1 will now be described. FIG. 3 is a perspective view of the directional coupler 1. The directional coupler 1 shown in FIG. 3 includes a stack 50 for integrating the components of the directional coupler 1. As will be described in detail later, the stack 50 includes a plurality of stacked dielectric layers and conductor layers.

The stack 50 is shaped like a rectangular solid and has a periphery. The periphery of the stack 50 includes a top surface 50A, a bottom surface 50B, and four side surfaces 50C, 50D, 50E and 50F. The top surface 50A and the bottom surface 50B are opposite each other. The side surfaces 50C and 50D are opposite each other. The side surfaces 50E and 50F are opposite each other. The side surfaces 50C to 50F are perpendicular to the top surface 50A and the bottom surface 50B. For the stack 50, a direction perpendicular to the top surface 50A and the bottom surface 50B is the stacking direction of the plurality of dielectric layers and conductor layers. The stacking direction is shown by the arrow T in FIG. 3.

The directional coupler 1 shown in FIG. 3 has an input terminal 111, an output terminal 112, a coupling terminal 113, an end terminal 114, and two ground terminals 115 and 116. The input terminal 111, the output terminal 112, the coupling terminal 113 and the end terminal 114 correspond to the input port 11, the output port 12, the coupling port 13 and the terminal port 14 shown in FIG. 1, respectively. The ground terminals 115 and 116 are connected to the ground. The terminals 111 to 116 are provided on the bottom surface 50B of the stack 50.

Figure 4:
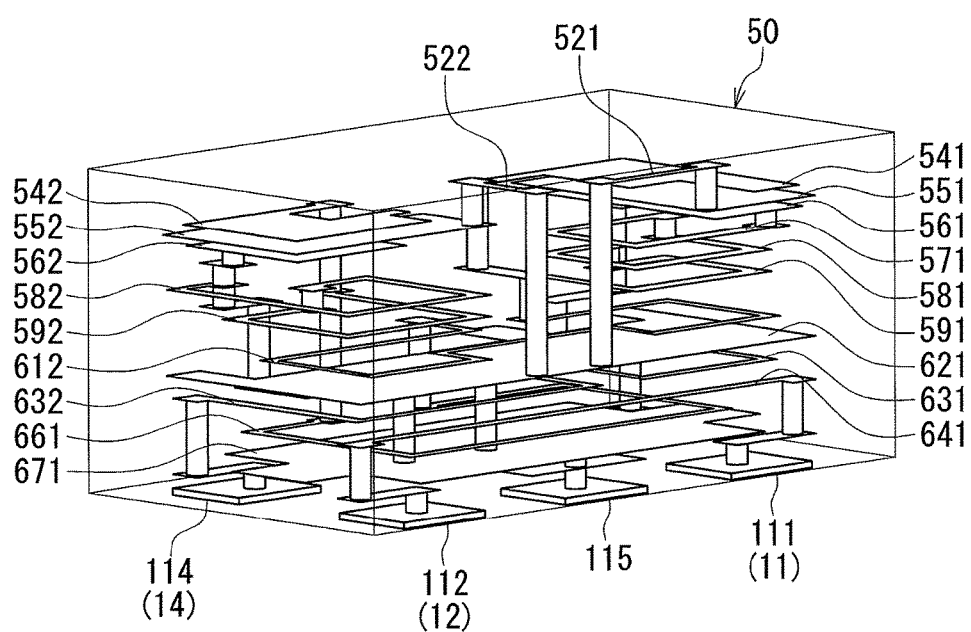
FIG. 4 is a perspective internal view of a stack included in the directional coupler shown in FIG. 3.
Figure 5:
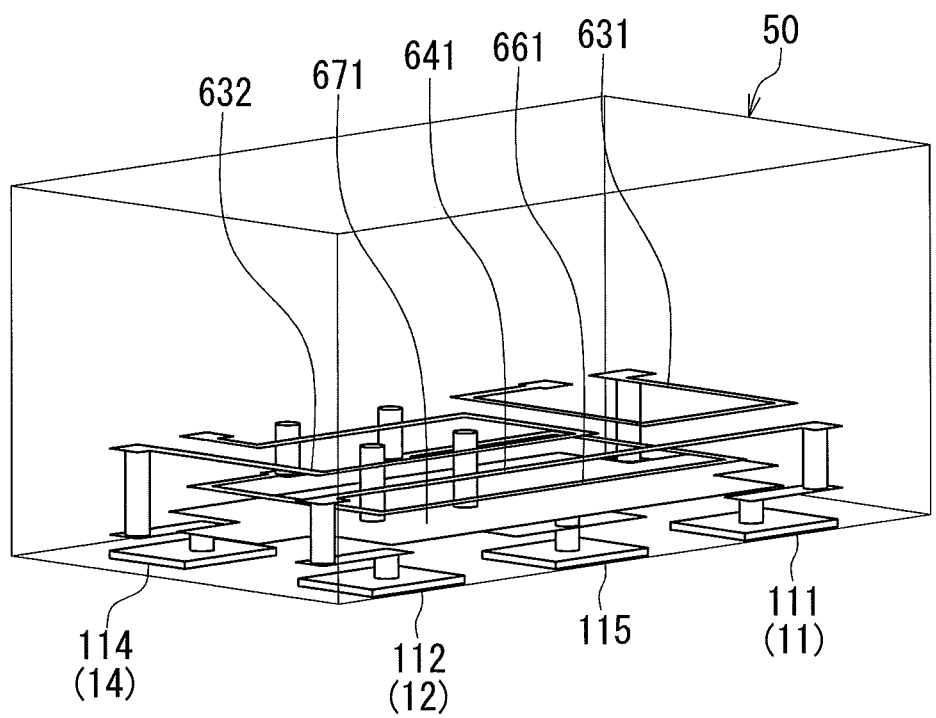
FIG. 5 is a perspective, partial internal view of the stack included in the directional coupler shown in FIG. 3.

The stack 50 will now be described in detail with reference to FIG. 4 to FIG. 10C. The stack 50 includes eighteen dielectric layers stacked on top of one another. The eighteen dielectric layers will be referred to as the first to eighteenth dielectric layers in the order from top to bottom. FIG. 4 is a perspective internal view of the stack 50. FIG. 5 is a perspective, partial internal view of the stack 50. FIG. 6A to FIG. 6D illustrate the top surfaces of the first to fourth dielectric layers, respectively. FIG. 7A to FIG. 7D illustrate the top surfaces of the fifth to eighth dielectric layers, respectively. FIG. 8A to FIG. 8D illustrate the top surfaces of the ninth to twelfth dielectric layers, respectively. FIG. 9A to FIG. 9D illustrate the top surfaces of the thirteenth to sixteenth dielectric layers, respectively. FIG. 10A and FIG. 10B illustrate the top surfaces of the seventeenth and eighteenth dielectric layers, respectively. FIG. 10C illustrates the bottom surface of the eighteenth dielectric layer. In FIG. 10C, the bottom surface of the eighteenth dielectric layer and conductor layers provided thereon can be seen from above.

Figure 6A:
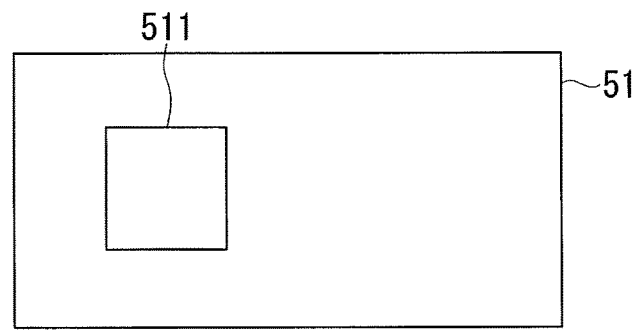
FIG. 6A to FIG. 6D are explanatory diagrams illustrating the respective top surfaces of the first to fourth dielectric layers of the stack included in the directional coupler shown in FIG. 3.
Figure 6B:
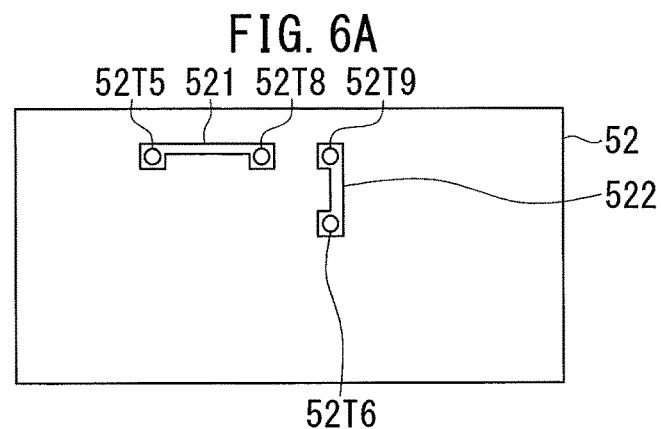

As shown in FIG. 6A, a conductor layer 511 is formed on the top surface of the first dielectric layer 51. The conductor layer 511 is used as a mark. As shown in FIG. 6B, conductor layers 521 and 522 are formed on the top surface of the second dielectric layer 52. The conductor layers 521 and 522 are used for forming the inductors L2A and L2B, respectively. Each of the conductor layers 521 and 522 has a first end and a second end. Further, through holes 52T5, 52T6, 52T8 and 52T9 are formed in the dielectric layer 52. The through hole 52T5 is connected to a portion of the conductor layer 521 near the first end thereof. The through hole 52T6 is connected to a portion of the conductor layer 522 near the first end thereof. The through hole 52T8 is connected to a portion of the conductor layer 521 near the second end thereof. The through hole 52T9 is connected to a portion of the conductor layer 522 near the second end thereof.

Figure 6C:
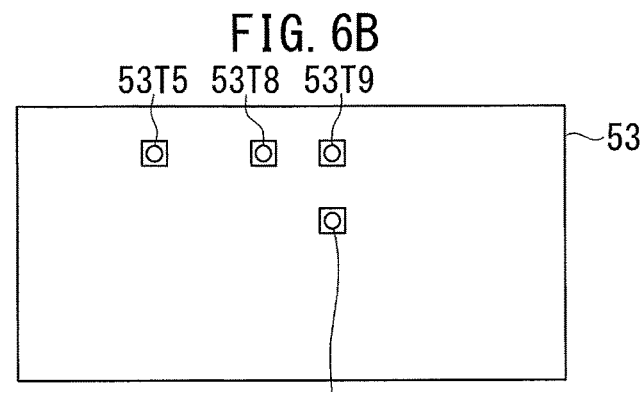

As shown in FIG. 6C, through holes 53T5, 53T6, 53T8 and 53T9 are formed in the third dielectric layer 53. The through holes 52T5, 52T6, 52T8 and 52T9 shown in FIG. 6B are connected to the through holes 53T5, 53T6, 53T8 and 53T9, respectively.

Figure 6D:
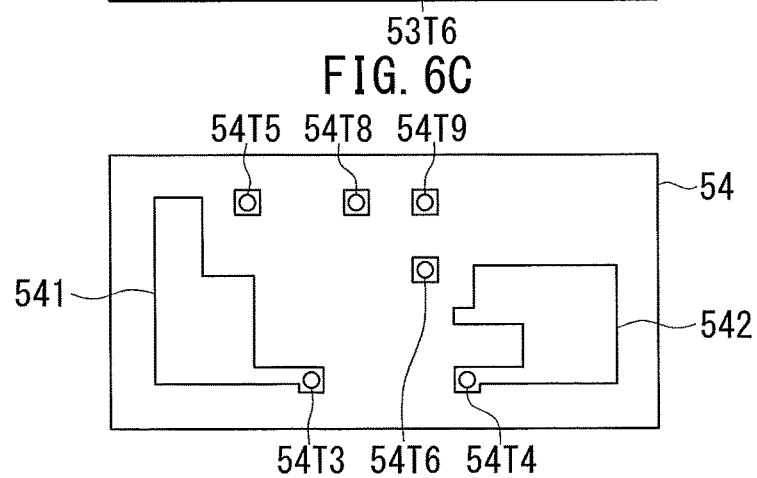

As shown in FIG. 6D, conductor layers 541 and 542 are formed on the top surface of the fourth dielectric layer 54. The conductor layers 541 and 542 are used for forming the capacitors C2A and C2B, respectively. Further, through holes 54T3, 54T4, 54T5, 54T6, 54T8 and 54T9 are formed in the dielectric layer 54. The through hole 54T3 is connected to the conductor layer 541. The through hole 54T4 is connected to the conductor layer 542. The through holes 53T5, 53T6, 53T8 and 53T9 shown in FIG. 6C are connected to the through holes 54T5, 54T6, 54T8 and 54T9, respectively.

Figure 7A:
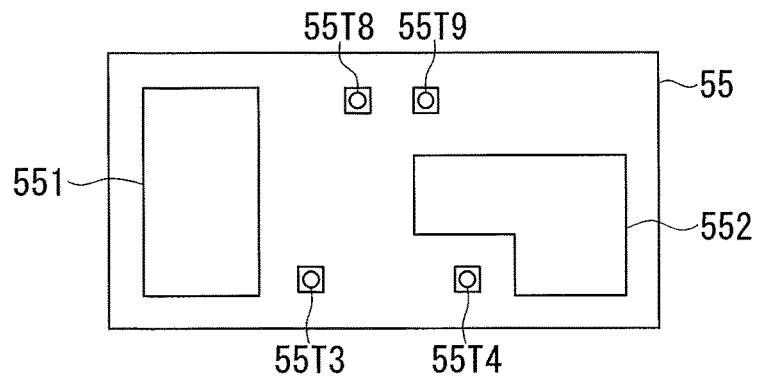
FIG. 7A to FIG. 7D are explanatory diagrams illustrating the respective top surfaces of the fifth to eighth dielectric layers of the stack included in the directional coupler shown in FIG. 3.

As shown in FIG. 7A, conductor layers 551 and 552 are formed on the top surface of the fifth dielectric layer 55. The conductor layer 551 is used for forming the capacitors C1A and C2A. The conductor layer 552 is used for forming the capacitors C1B and C2B. Further, through holes 55T3, 55T4, 55T8 and 55T9 are formed in the dielectric layer 55. The through holes 54T3, 54T4, 54T8 and 54T9 shown in FIG. 6D are connected to the through holes 55T3, 55T4, 55T8 and 55T9, respectively. The through hole 54T5 shown in FIG. 6D is connected to the conductor layer 551. The through hole 54T6 shown in FIG. 6D is connected to the conductor layer 552.

Figure 7B:
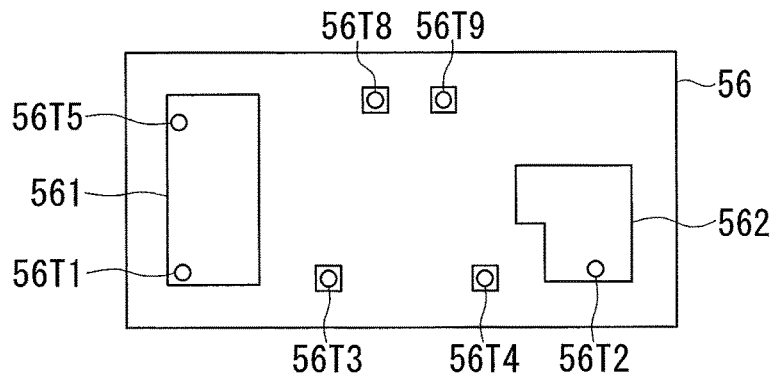

As shown in FIG. 7B, conductor layers 561 and 562 are formed on the top surface of the sixth dielectric layer 56. The conductor layers 561 and 562 are used for forming the capacitors C1A and C1B, respectively. Further, through holes 56T1, 56T2, 56T3, 56T4, 56T5, 56T8 and 56T9 are formed in the dielectric layer 56. The through holes 56T1 and 56T5 are connected to the conductor layer 561. The through hole 56T2 is connected to the conductor layer 562. The through holes 55T3, 55T4, 55T8 and 55T9 shown in FIG. 7A are connected to the through holes 56T3, 56T4, 56T8 and 56T9, respectively.

Figure 7C:
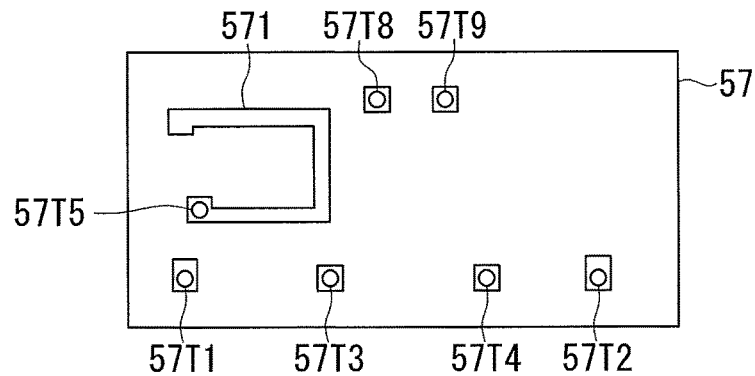

As shown in FIG. 7C, a conductor layer 571 is formed on the top surface of the seventh dielectric layer 57. The conductor layer 571 is used for forming the inductor L1A, and has a first end and a second end. Further, through holes 57T1, 57T2, 57T3, 57T4, 57T5, 57T8 and 57T9 are formed in the dielectric layer 57. The through holes 56T1, 56T2, 56T3, 56T4, 56T8 and 56T9 shown in FIG. 7B are connected to the through holes 57T1, 57T2, 57T3, 57T4, 57T8 and 57T9, respectively. The through hole 57T5 is connected to a portion of the conductor layer 571 near the first end thereof. The through hole 56T5 shown in FIG. 7B is connected to a portion of the conductor layer 571 near the second end thereof.

Figure 7D:
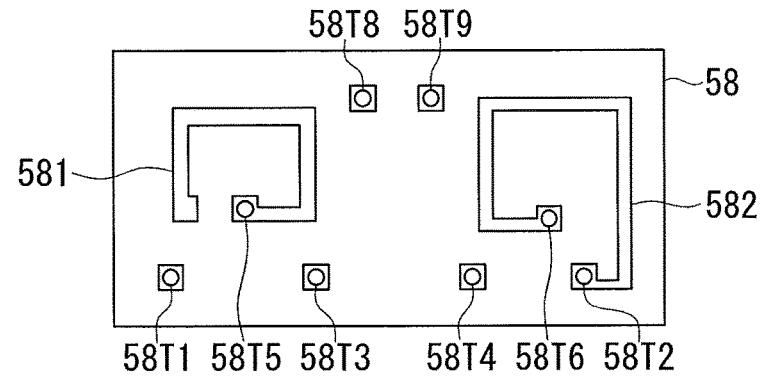

As shown in FIG. 7D, conductor layers 581 and 582 are formed on the top surface of the eighth dielectric layer 58. The conductor layers 581 and 582 are used for forming the inductors L1A and L1B, respectively. Each of the conductor layers 581 and 582 has a first end and a second end. Further, through holes 58T1, 58T2, 58T3, 58T4, 58T5, 58T6, 58T8 and 58T9 are formed in the dielectric layer 58. The through holes 57T1, 57T3, 57T4, 57T8 and 57T9 shown in FIG. 7C are connected to the through holes 58T1, 58T3, 58T4, 58T8 and 58T9, respectively. The through hole 58T2 is connected to a portion of the conductor layer 582 near the first end thereof and to the through hole 57T2 shown in FIG. 7C. The through hole 58T5 is connected to a portion of the conductor layer 581 near the first end thereof. The through hole 58T6 is connected to a portion of the conductor layer 582 near the second end thereof. The through hole 57T5 shown in FIG. 7C is connected to a portion of the conductor layer 581 near the second end thereof.

Figure 8A:
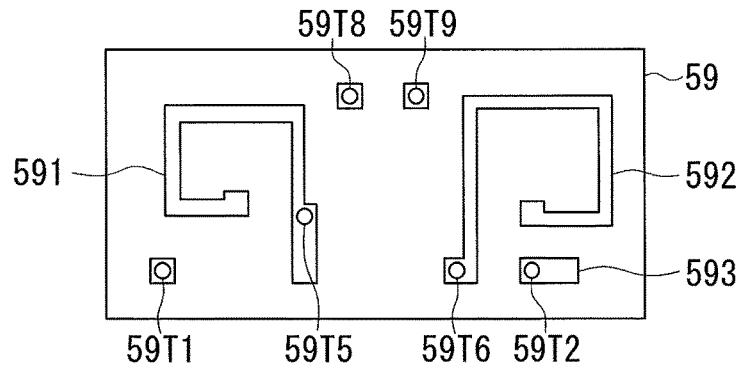
FIG. 8A to FIG. 8D are explanatory diagrams illustrating the respective top surfaces of the ninth to twelfth dielectric layers of the stack included in the directional coupler shown in FIG. 3.

As shown in FIG. 8A, conductor layers 591, 592 and 593 are formed on the top surface of the ninth dielectric layer 59. The conductor layers 591 and 592 are used for forming the inductors L1A and L1B, respectively. Each of the conductor layers 591 and 592 has a first end and a second end. Further, through holes 59T1, 59T2, 59T5, 59T6, 59T8 and 59T9 are formed in the dielectric layer 59. The through holes 58T1, 58T8 and 58T9 shown in FIG. 7D are connected to the through holes 59T1, 59T8 and 59T9, respectively. The through hole 59T2 is connected the conductor layer 593. The through hole 59T5 is connected to a portion of the conductor layer 591 between the first and second ends thereof. The through hole 59T6 is connected to a portion of the conductor layer 592 near the first end thereof and to the through hole 58T4 shown in FIG. 7D. The through hole 58T2 shown in FIG. 7D is connected to the conductor layer 593. The through hole 58T3 shown in FIG. 7D is connected to a portion of the conductor layer 591 near the first end thereof. The through hole 58T5 shown in FIG. 7D is connected to a portion of the conductor layer 591 near the second end thereof. The through hole 58T6 shown in FIG. 7D is connected to a portion of the conductor layer 592 near the second end thereof.

Figure 8B:
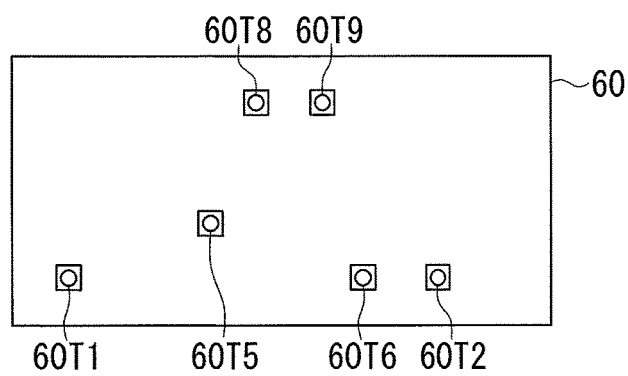

As shown in FIG. 8B, through holes 60T1, 60T2, 60T5, 60T6, 60T8 and 60T9 are formed in the tenth dielectric layer 60. The through holes 59T1, 59T2, 59T5, 59T6, 59T8 and 54T9 shown in FIG. 8A are connected to the through holes 60T1, 60T2, 60T5, 60T6, 60T8 and 60T9, respectively.

Figure 8C:
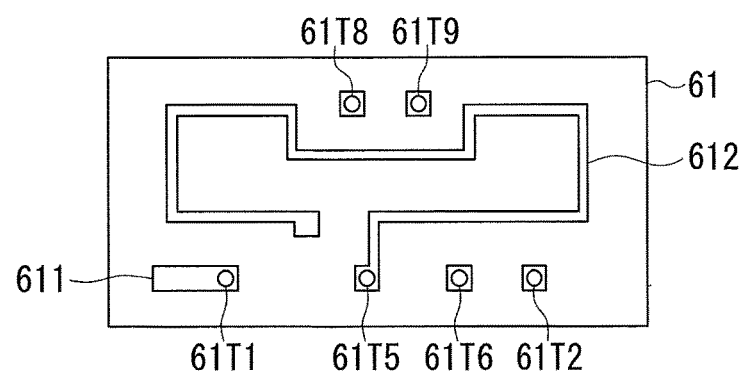

As shown in FIG. 8C, conductor layers 611 and 612 are formed on the top surface of the eleventh dielectric layer 61. The conductor layer 612 has a first end and a second end. Further, through holes 61T1, 61T2, 61T5, 61T6, 61T8 and 61T9 are formed in the dielectric layer 61. The through hole 61T1 is connected to the conductor layer 611. The through holes 60T2, 60T6, 60T8 and 60T9 shown in FIG. 8B are connected to the through holes 61T2, 61T6, 61T8 and 61T9, respectively. The through hole 61T5 is connected to a portion of the conductor layer 612 near the first end thereof. The through hole 60T1 shown in FIG. 8B is connected the conductor layer 611. The through hole 60T5 shown in FIG. 8B is connected to a portion of the conductor layer 612 near the second end thereof.

Figure 8D:
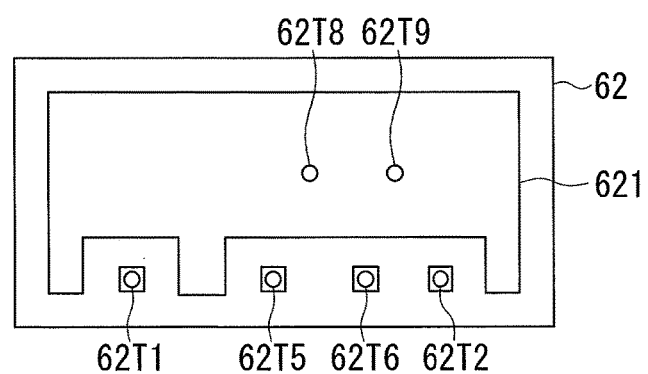

As shown in FIG. 8D, a ground conductor layer 621 is formed on the top surface of the twelfth dielectric layer 62. Further, through holes 62T1, 62T2, 62T5, 62T6, 62T8 and 62T9 are formed in the dielectric layer 62. The through holes 61T1, 61T2, 61T5 and 61T6 shown in FIG. 8C are connected to the through holes 62T1, 62T2, 62T5 and 62T6, respectively. The through holes 62T8 and 62T9, and the through holes 61T8 and 61T9 shown in FIG. 8C are connected to the conductor layer 621.

Figure 9A:
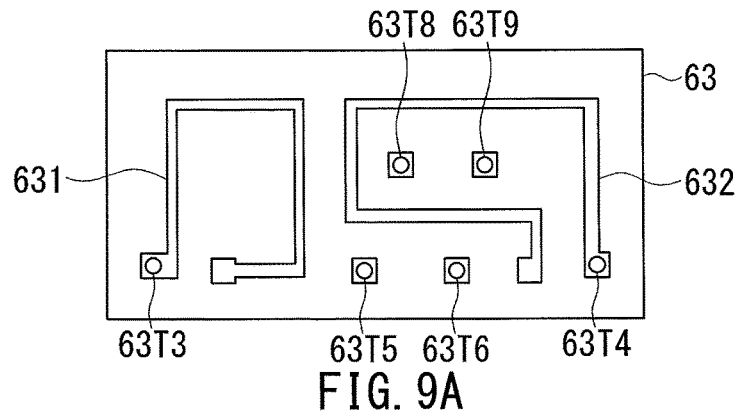
FIG. 9A to FIG. 9D are explanatory diagrams illustrating the respective top surfaces of the thirteenth to sixteenth dielectric layers of the stack included in the directional coupler shown in FIG. 3.
Figure 10A:
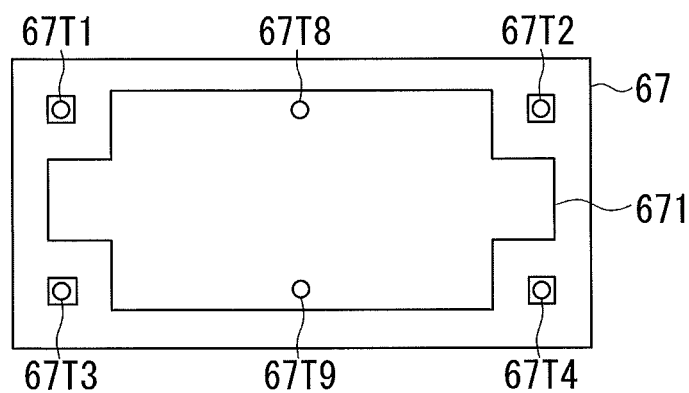
FIG. 10A to FIG. 10C are explanatory diagrams respectively illustrating the top surface of the seventeenth dielectric layer, the top surface of the eighteenth dielectric layer, and the bottom surface of the eighteenth dielectric layer of the stack included in the directional coupler shown in FIG. 3.
Figure 10B:
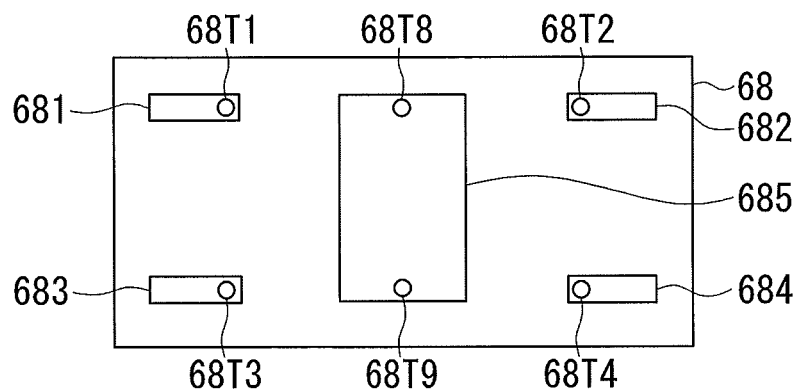
Figure 10C:
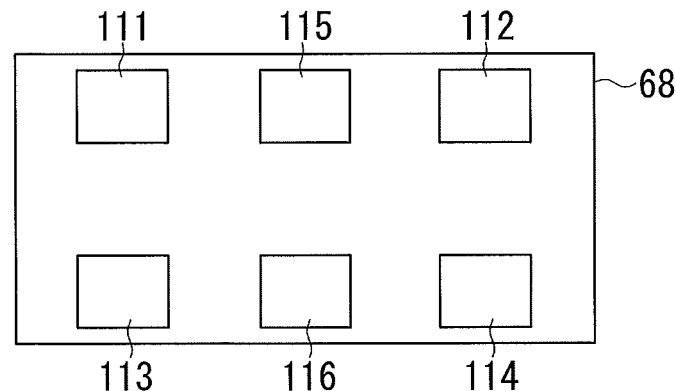

As shown in FIG. 9A, conductor layers 631 and 632 are formed on the top surface of the thirteenth dielectric layer 63. The conductor layers 631 and 632 are used for forming the first and third subline sections 20A and 20C, respectively. Each of the conductor layers 631 and 632 has a first end and a second end. Further, through holes 63T3, 63T4, 63T5, 63T6, 63T8 and 63T9 are formed in the dielectric layer 63. The through hole 63T3 is connected to a portion of the conductor layer 631 near the first end thereof. The through hole 63T4 is connected to a portion of the conductor layer 632 near the first end thereof. The through holes 62T5, 62T6, 62T8 and 62T9 shown in FIG. 8D are connected to the through holes 63T5, 63T6, 63T8 and 63T9, respectively. The through hole 62T1 shown in FIG. 8D is connected to a portion of the conductor layer 631 near the second end thereof. The through hole 62T2 shown in FIG. 8D is connected to a portion of the conductor layer 632 near the second end thereof.

Figure 9B:
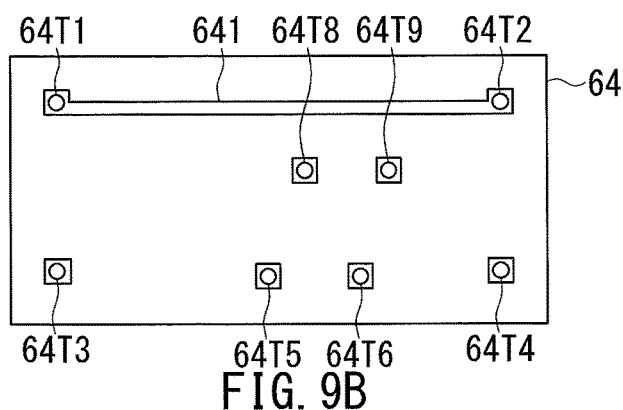

As shown in FIG. 9B, a conductor layer 641 is formed on the top surface of the fourteenth dielectric layer 64. The conductor layer 641 is used for forming the main line 10, and has a first end and a second end. Further, through holes 64T1, 64T2, 64T3, 64T4, 64T5, 64T6, 64T8 and 64T9 are formed in the dielectric layer 64. The through hole 64T1 is connected to a portion of the conductor layer 641 near the first end thereof. The through hole 64T2 is connected to a portion of the conductor layer 641 near the second end thereof. The through holes 63T3, 63T4, 63T5, 63T6, 63T8 and 63T9 shown in FIG. 9A are connected to the through holes 64T3, 64T4, 64T5, 64T6, 64T8 and 64T9, respectively.

Figure 9C:
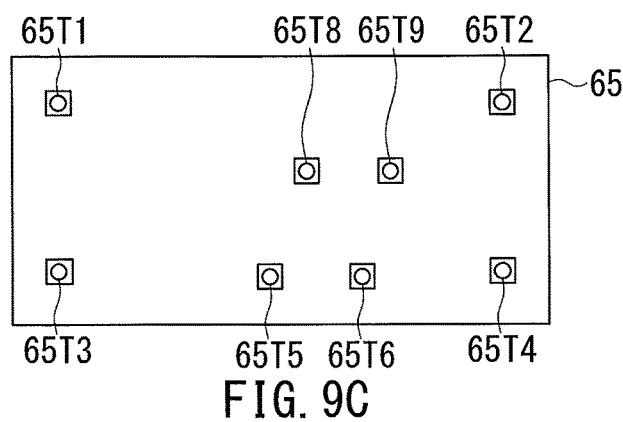

As shown in FIG. 9C, through holes 65T1, 65T2, 65T3, 65T4, 65T5, 65T6, 65T8 and 65T9 are formed in the fifteenth dielectric layer 65. The through holes 64T1, 64T2, 64T3, 64T4, 64T5, 64T6, 64T8 and 64T9 shown in FIG. 9B are connected to the through holes 65T1, 65T2, 65T3, 65T4, 65T5, 65T6, 65T8 and 65T9, respectively.

Figure 9D:
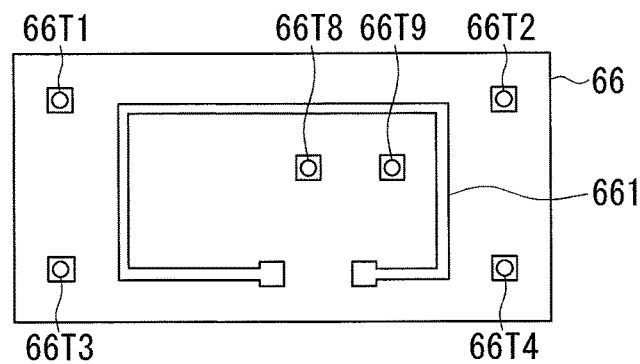

As shown in FIG. 9D, a conductor layer 661 is formed on the top surface of the sixteenth dielectric layer 66. The conductor layer 661 is used for forming the second subline section 20B, and has a first end and a second end. Further, through holes 66T1, 66T2, 66T3, 66T4, 66T8 and 66T9 are formed in the dielectric layer 66. The through holes 65T1, 65T2, 65T3, 65T4, 65T8 and 65T9 shown in FIG. 9C are connected to the through holes 66T1, 66T2, 66T3, 66T4, 66T8 and 66T9, respectively. The through hole 65T5 shown in FIG. 9C is connected to a portion of the conductor layer 661 near the first end thereof. The through hole 65T6 shown in FIG. 9C is connected to a portion of the conductor layer 661 near the second end thereof.

As shown in FIG. 10A, a ground conductor layer 671 is formed on the top surface of the seventeenth dielectric layer 67. Further, through holes 67T1, 67T2, 67T3, 67T4, 67T8 and 67T9 are formed in the dielectric layer 67. The through holes 66T1, 66T2, 66T3 and 66T4 shown in FIG. 9D are connected to the through holes 67T1, 67T2, 67T3 and 67T4, respectively. The through holes 67T8 and 67T9, and the through holes 66T8 and 66T9 shown in FIG. 9D are connected to the conductor layer 671.

As shown in FIG. 10B, conductor layers 681, 682, 683 and 684 and a ground conductor layer 685 are formed on the top surface of the eighteenth dielectric layer 68. Further, through holes 68T1, 68T2, 68T3, 68T4, 68T8 and 68T9 are formed in the dielectric layer 68. The through hole 68T1 is connected to the conductor layer 681. The through hole 68T2 is connected to the conductor layer 682. The through hole 68T3 is connected to the conductor layer 683. The through hole 68T4 is connected to the conductor layer 684. The through hole 67T1 shown in FIG. 10A is connected to the conductor layer 681. The through hole 67T2 shown in FIG. 10A is connected to the conductor layer 682. The through hole 67T3 shown in FIG. 10A is connected to the conductor layer 683. The through hole 67T4 shown in FIG. 10A is connected to the conductor layer 684. The through holes 68T8 and 68T9, and the through holes 67T8 and 67T9 shown in FIG. 10A are connected to the conductor layer 685.

The input terminal 111, the output terminal 112, the coupling terminal 113, the end terminal 114, and the two ground terminals 115 and 116 are formed on the bottom surface of the eighteenth dielectric layer 68 shown in FIG. 10C, that is, the bottom surface 50B of the stack 50. The through hole 68T1 shown in FIG. 10B is connected to the input terminal 111. The through hole 68T2 shown in FIG. 10B is connected to the output terminal 112. The through hole 68T3 shown in FIG. 10B is connected to the coupling terminal 113. The through hole 68T4 shown in FIG. 10B is connected to the end terminal 114. The through hole 68T8 shown in FIG. 10B is connected to the ground terminal 115. The through hole 68T9 shown in FIG. 10B is connected to the ground terminal 116.

The stack 50 shown in FIG. 3 is formed by stacking the first to eighteenth dielectric layers 51 to 68. Then, the terminals 111 to 116 are formed on the bottom surface 50B of the stack 50 to complete the directional coupler 1 shown in FIG. 3. FIG. 3 omits the illustration of the conductor layer 511.

FIG. 4 shows the interior of the stack 50. FIG. 5 shows part of the interior of the stack 50. FIG. 5 omits the illustration of some of the conductor layers that are located on or above the conductor layers 631 and 632.

Correspondences of the circuit components of the directional coupler 1 shown in FIG. 1 with the components inside the stack 50 shown in FIG. 6A to FIG. 10C will now be described. The main line 10 is formed by the conductor layer 641 shown in FIG. 9B. The conductor layer 641 includes a first portion forming the first portion 10A of the main line 10, a second portion forming the second portion 10B of the main line 10, and a third portion forming the third portion 10C of the main line 10. A part of the conductor layer 641 belongs to the first portion and the second portion of the conductor layer 641. Another part of the conductor layer 641 belongs to the third portion and the second portion of the conductor layer 641.

A portion of the conductor layer 631 shown in FIG. 9A is opposed to the top surface of the first portion of the conductor layer 641 with the dielectric layer 63 interposed therebetween. This portion of the conductor layer 631 constitutes the first subline section 20A.

A portion of the conductor layer 661 shown in FIG. 9D is opposed to the bottom surface of the second portion of the conductor layer 641 with the dielectric layers 64 and 65 interposed therebetween. This portion of the conductor layer 661 constitutes the second subline section 20B.

A portion of the conductor layer 632 shown in FIG. 9A is opposed to the top surface of the third portion of the conductor layer 641 with the dielectric layer 63 interposed therebetween. This portion of the conductor layer 632 constitutes the third subline section 20C.

The inductor L1A of the first matching section 30A is formed as follows. The conductor layers 571, 581 and 591 shown in FIGS. 7C, 7D and 8A are connected to each other in series via the through holes 57T5 and 58T5. The inductor L1A is constituted by these conductor layers 571, 581 and 591 and the two through holes 57T5 and 58T5 connecting them. The conductor layer 571 is connected to the conductor layer 631 constituting the first subline section 20A via the through hole 56T5, the conductor layer 561, the through holes 56T1, 57T1, 58T1, 59T1 and 60T1, the conductor layer 611, and the through holes 61T1 and 62T1. The conductor layer 591 is connected to the conductor layer 661 constituting the second subline section 20B via the through holes 56T5 and 60T5, the conductor layer 612, and the through holes 51T5, 62T5, 63T5, 64T5 and 65T5.

The capacitor C1A of the first matching section 30A is constituted by the conductor layers 551 and 561 shown in FIGS. 7A and 7B and the dielectric layer 55 interposed therebetween. The conductor layer 561 is connected to the conductor layer 631 constituting the first subline section 20A via the through holes 56T1, 57T1, 58T1, 59T1 and 60T1, the conductor layer 611, and the through holes 61T1 and 62T1.

The capacitor C2A of the first matching section 30A is constituted by the conductor layers 541 and 551 shown in FIGS. 6D and 7A and the dielectric layer 54 interposed therebetween. The conductor layer 541 is connected to the conductor layer 661 constituting the second subline section 20B via the through holes 54T3, 55T3, 56T3, 57T3 and 58T3, the conductor layer 591, the through holes 59T5 and 60T5, the conductor layer 612, and the through holes 61T5, 62T5, 63T5, 64T5 and 65T5.

The inductor L2A of the first matching section 30A is constituted by the conductor layer 521 shown in FIG. 6B. The portion of the conductor layer 521 near the first end thereof is connected to the conductor layer 551 shown in FIG. 7A via the through holes 52T5, 53T5 and 54T5. The portion of the conductor layer 521 near the second end thereof is connected to the conductor layer 621 shown in FIG. 8D via the through holes 52T8, 53T8, 54T8, 55T8, 56T8, 57T8, 58T8, 59T8, 60T8 and 61T8.

The inductor L1B of the second matching section 30B is formed as follows. The conductor layers 582 and 592 shown in FIGS. 7D and 8A are connected to each other in series via the through hole 58T6. The inductor L1B is constituted by these conductor layers 582 and 592 and the through hole 58T6 connecting them. The conductor layer 592 is connected to the conductor layer 661 constituting the second subline section 20B via the through holes 59T6, 60T6, 61T6, 62T6, 63T6, 64T6 and 65T6. The conductor layer 582 is connected to the conductor layer 632 constituting the third subline section 20C via the through hole 58T2, the conductor layer 593, and the through holes 59T2, 60T2, 61T2 and 62T2.

The capacitor C1B of the second matching section 30B is constituted by the conductor layers 552 and 562 shown in FIGS. 7A and 7B and the dielectric layer 55 interposed therebetween. The conductor layer 562 is connected to the conductor layer 632 constituting the third subline section 20C via the through holes 56T2, 57T2 and 58T2, the conductor layer 593, and the through holes 59T2, 60T2, 61T2 and 62T2.

The capacitor C2B of the second matching section 30B is constituted by the conductor layers 542 and 552 shown in FIGS. 6D and 7A and the dielectric layer 54 interposed therebetween. The conductor layer 542 is connected to the conductor layer 661 constituting the second subline section 20B via the through holes 54T4, 55T4, 56T4, 57T4, 58T4, 59T6, 60T6, 61T6, 62T6, 63T6, 64T6 and 65T6.

The inductor L2B of the second matching section 30B is constituted by the conductor layer 522 shown in FIG. 6B. The portion of the conductor layer 522 near the first end thereof is connected to the conductor layer 552 shown in FIG. 7A via the through holes 52T6, 53T6 and 54T6. The portion of the conductor layer 522 near the second end thereof is connected to the conductor layer 621 shown in FIG. 8D via the through holes 52T9, 53T9, 54T9, 55T9, 56T9, 57T9, 58T9, 59T9, 60T9 and 61T9.

In the stack 50, the ground conductor layer 621 connected to the ground is interposed between the conductor layer 641 constituting the main line 10 and the conductor layers constituting the first and second matching sections 30A and 30B. Thus, the first and second matching sections 30A and 30B are not configured to be electromagnetically coupled to the main line 10.

The directional coupler 1 shown in FIG. 1 includes a plurality of pairs of elements each consisting of an element in the first matching section 30A and an element in the second matching section 30B that are symmetrically located in terms of circuitry. Specifically, the first inductors L1A and MB are paired with each other, the second inductors L2A and L2B are paired with each other, the first capacitors C1A and C1B are paired with each other, and the second capacitors C2A and C2B are paired with each other. On the other hand, in the internal configuration of the stack 50 shown in FIG. 6A to FIG. 10C, the configuration of the first matching section 30A and the configuration of the second matching section 30B are physically asymmetric. Accordingly, in at least one of the plurality of pairs of elements, the paired elements have mutually different element values. The first matching section 30A and the second matching section 30B thus have mutually different characteristics.

Figure 11:
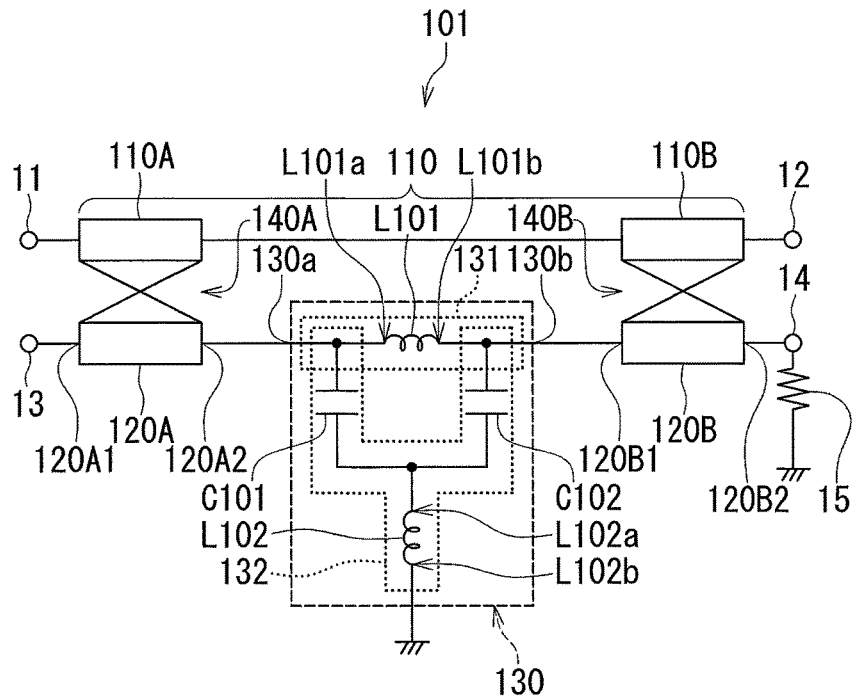
FIG. 11 is a circuit diagram illustrating the circuitry of a directional coupler of a comparative example.

Now, the effects of the directional coupler 1 according to the first embodiment will be described in more detail in comparison with a directional coupler of a comparative example. First, reference is made to FIG. 11 to describe the circuitry of the directional coupler 101 of the comparative example. Like the directional coupler 1 according to the first embodiment, the directional coupler 101 of the comparative example includes an input port 11, an output port 12, a coupling port 13, and a terminal port 14. The terminal port 14 is grounded via a terminator having a resistance of 50Ω, for example. The directional coupler 101 of the comparative example further includes: a main line 110 connecting the input port 11 and the output port 12; a first subline section 120A and a second subline section 120B each of which is formed of a line configured to be electromagnetically coupled to the main line 110; and a matching section 130 provided between the first subline section 120A and the second subline section 120B.

The first subline section 120A has a first end 120A1 and a second end 120A2 opposite to each other. The second subline section 120B has a first end 120B1 and a second end 120B2 opposite to each other. The matching section 130 has a first end 130a and a second end 130b opposite to each other. The first end 120A1 of the first subline section 120A is connected to the coupling port 13. The first end 130a of the matching section 130 is connected to the second end 120A2 of the first subline section 120A. The first end 120B1 of the second subline section 120B is connected to the second end 130b of the matching section 130. The second end 120B2 of the second subline section 120B is connected to the terminal port 14.

The matching section 130 includes a first path 131 connecting the first end 130a and the second end 130b, and a second path 132 connecting the first path 131 and the ground. The first path 131 includes a first inductor L101. The first inductor L101 has a first end L101a and a second end L101b opposite to each other.

The second path 132 includes a first capacitor C101 and a second inductor L102 connected in series. The second inductor L102 has a first end L102a and a second end L102b. In terms of circuitry, the first end L102a is closest to the first path 131, and the second end L102b is closest to the ground. The first capacitor C101 is provided between the first end L101a of the first inductor L101 and the first end L102a of the second inductor L102. The second path 132 further includes a second capacitor C102 provided between the second end L101b of the first inductor L101 and the first end L102a of the second inductor L102.

The main line 110 includes a first portion 110A to be electromagnetically coupled to the first subline section 120A, and a second portion 110B to be electromagnetically coupled to the second subline section 120B. Here, a portion of the main line 110 to be coupled to the first subline section 120A, i.e., the first portion 110A, and the first subline section 120A in combination will be referred to as the first coupling section 140A. A portion of the main line 110 to be coupled to the second subline section 120B, i.e., the second portion 110B, and the second subline section 120B in combination will be referred to as the second coupling section 140B.

The strength of coupling of the first subline section 120A to the first portion 110A of the main line 110 will be referred to as the coupling of the first coupling section 140A alone. The strength of coupling of the second subline section 120B to the second portion 110B of the main line 110 will be referred to as the coupling of the second coupling section 140B alone. The coupling of the second coupling section 140B alone is higher than the coupling of the first coupling section 140A alone.

Figure 12:
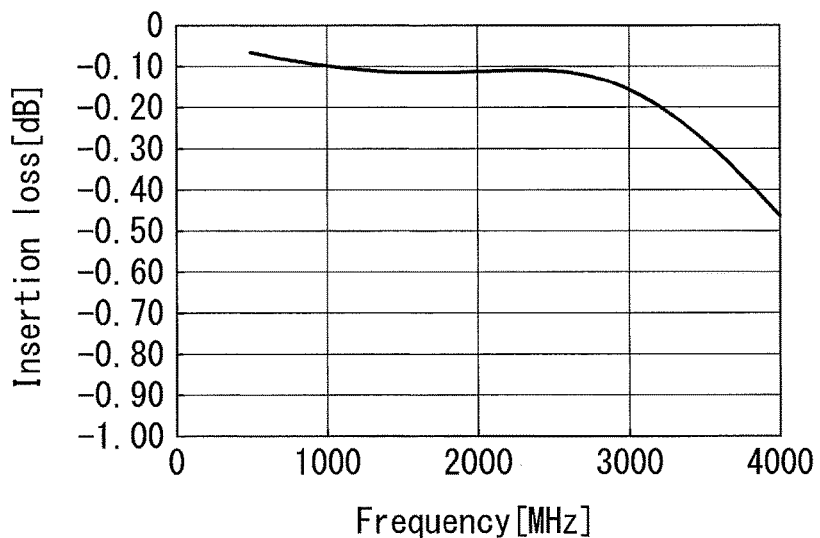
FIG. 12 is a characteristic diagram illustrating the frequency response of the insertion loss of the directional coupler of the comparative example.
Figure 13:
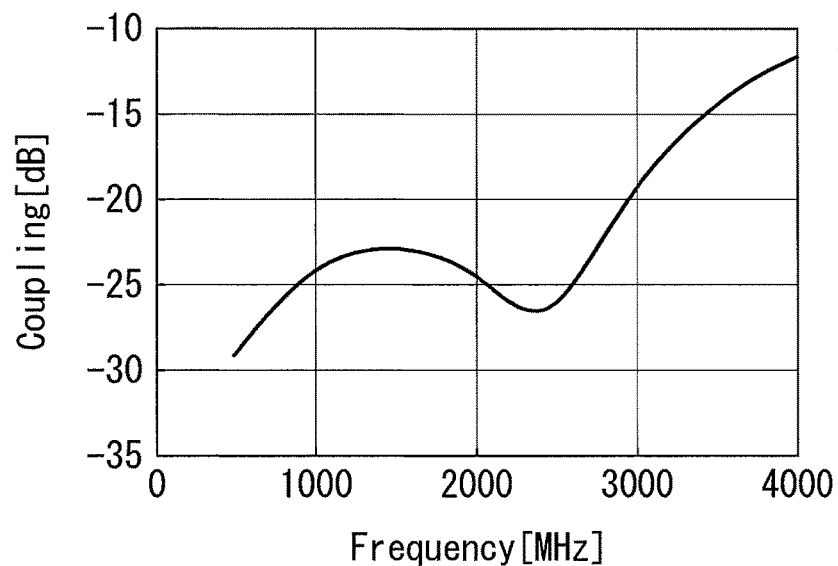
FIG. 13 is a characteristic diagram illustrating the frequency response of the coupling of the directional coupler of the comparative example.
Figure 14:
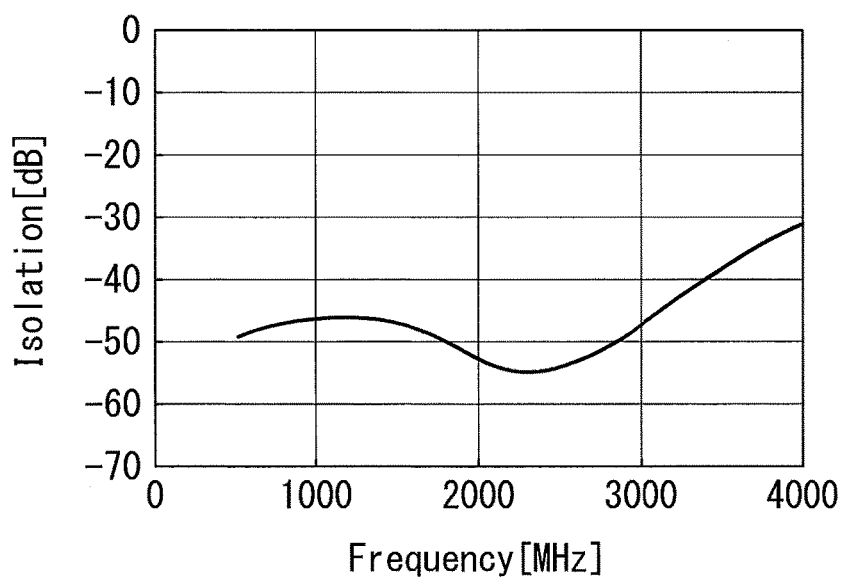
FIG. 14 is a characteristic diagram illustrating the frequency response of the isolation of the directional coupler of the comparative example.
Figure 15:
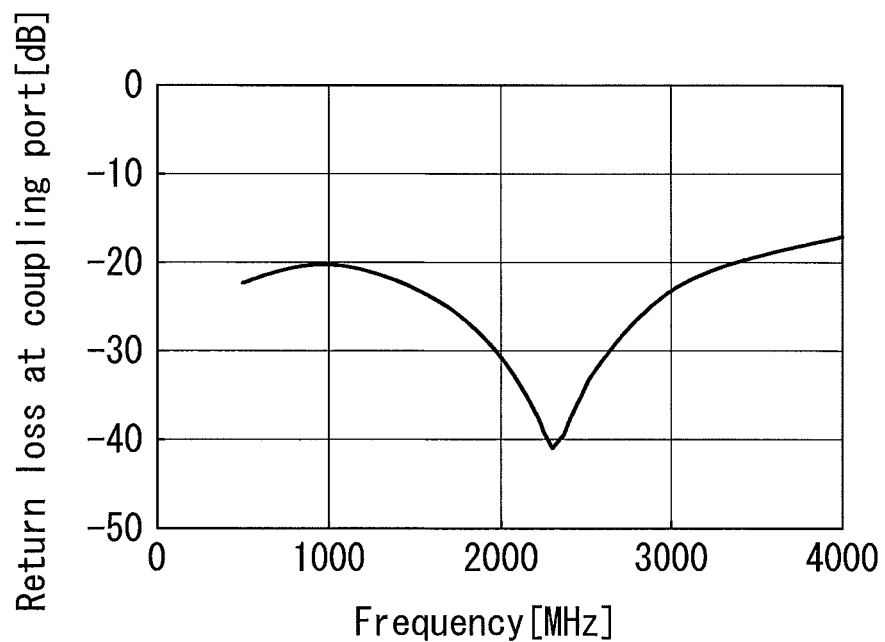
FIG. 15 is a characteristic diagram illustrating the frequency response of the return loss at the coupling port of the directional coupler of the comparative example.

The matching section 130 is a circuit for performing impedance matching between a signal source and a load, assuming a situation in which the terminal port 14 is grounded via the terminator 15 serving as the load, and the coupling port 13 is connected with the signal source having an output impedance equal to the resistance of the terminator 15 (e.g., 50Ω). On the assumption of the above situation, the matching section 130 is designed so that the reflection coefficient as viewed in the direction from the coupling port 13 to the terminal port 14 has an absolute value of zero or near zero in the service frequency band of the directional coupler 101 of the comparative example. The matching section 130 causes a change in the phase of a signal passing therethrough Reference is now made to FIG. 12 to FIG. 15 to describe the characteristics of the directional coupler 101 of the comparative example. FIG. 12 is a characteristic diagram illustrating the frequency response of the insertion loss of the directional coupler 101 of the comparative example. In FIG. 12, the horizontal axis represents frequency, and the vertical axis represents insertion loss. FIG. 13 is a characteristic diagram illustrating the frequency response of the coupling of the directional coupler 101 of the comparative example. In FIG. 13, the horizontal axis represents frequency, and the vertical axis represents coupling. FIG. 14 is a characteristic diagram illustrating the frequency response of the isolation of the directional coupler 101 of the comparative example. In FIG. 14, the horizontal axis represents frequency, and the vertical axis represents isolation. FIG. 15 is a characteristic diagram illustrating the frequency response of the return loss at the coupling port 13 of the directional coupler 101 of the comparative example. In FIG. 15, the horizontal axis represents frequency, and the vertical axis represents return loss.

As shown in FIG. 13, the frequency response of the coupling of the directional coupler 101 of the comparative example has one attenuation pole at a frequency of approximately 2400 MHz. Further, according to the frequency response of the coupling of the directional coupler 101, the coupling increases with increasing frequency in a frequency region higher than the frequency at which the attenuation pole occurs.

Figure 16:
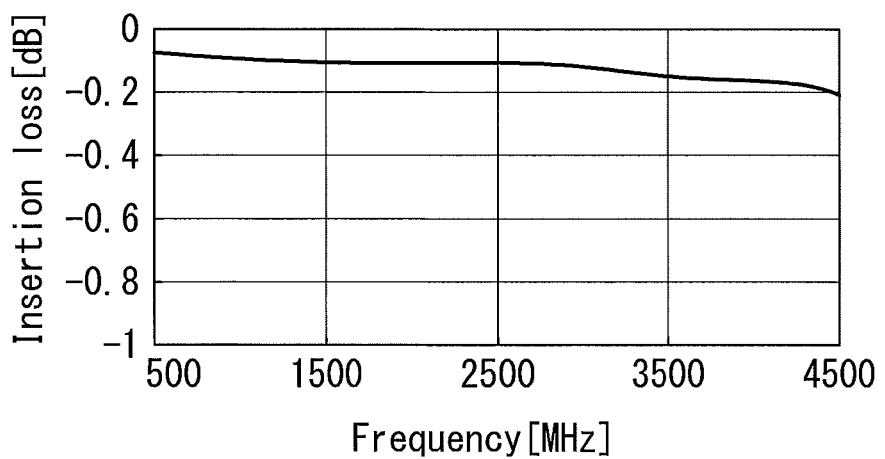
FIG. 16 is a characteristic diagram illustrating the frequency response of the insertion loss of the directional coupler according to the first embodiment of the invention.
Figure 17:
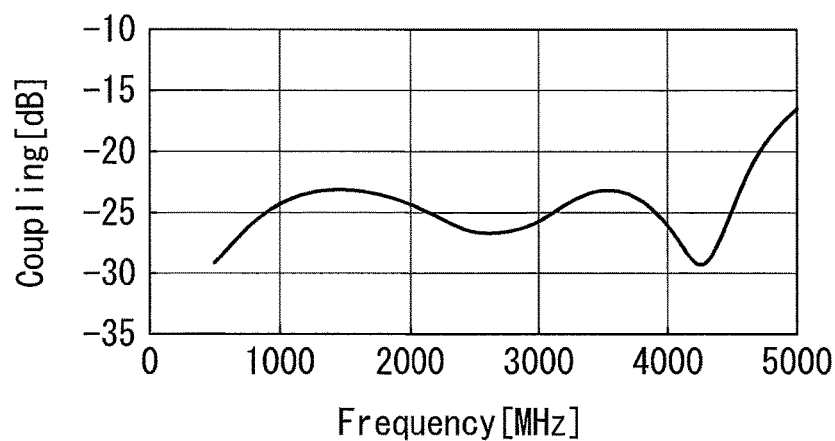
FIG. 17 is a characteristic diagram illustrating the frequency response of the coupling of the directional coupler according to the first embodiment of the invention.
Figure 18:
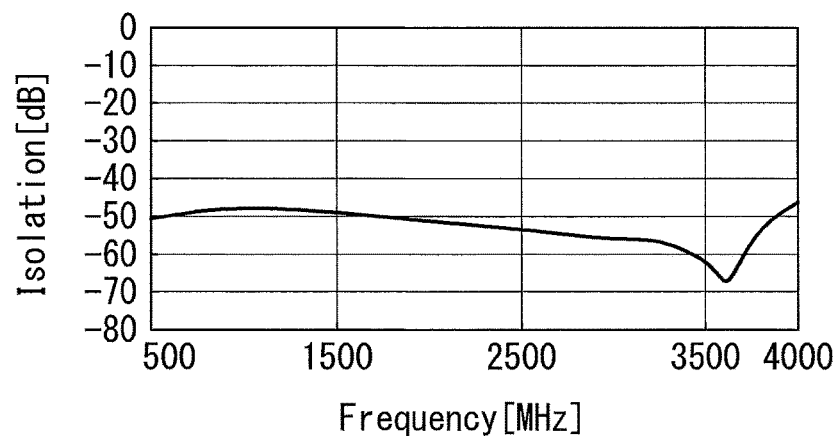
FIG. 18 is a characteristic diagram illustrating the frequency response of the isolation of the directional coupler according to the first embodiment of the invention.
Figure 19:
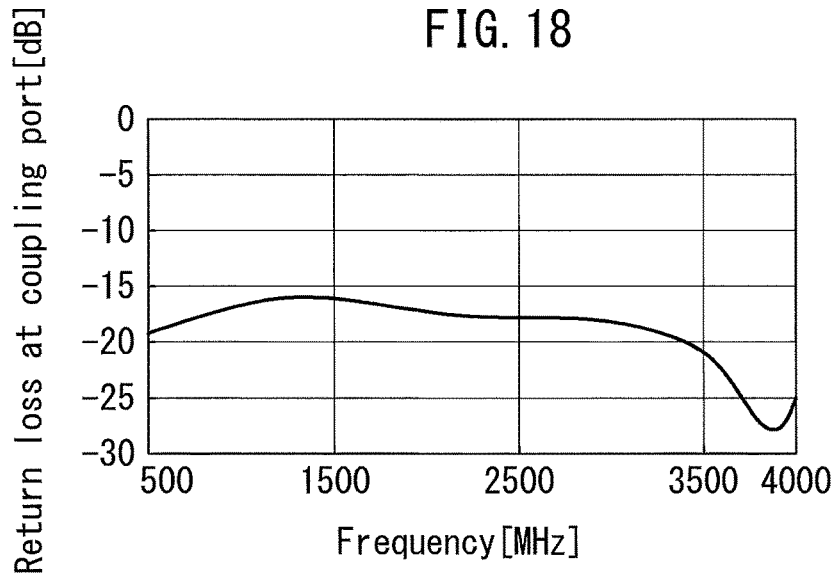
FIG. 19 is a characteristic diagram illustrating the frequency response of the return loss at the coupling port of the directional coupler according to the first embodiment of the invention.

An example of characteristics of the directional coupler 1 according to the first embodiment will now be described with reference to FIG. 16 to FIG. 19. FIG. 16 is a characteristic diagram illustrating the frequency response of the insertion loss of the directional coupler 1. In FIG. 16, the horizontal axis represents frequency, and the vertical axis represents insertion loss. FIG. 17 is a characteristic diagram illustrating the frequency response of the coupling of the directional coupler 1. In FIG. 17, the horizontal axis represents frequency, and the vertical axis represents coupling. FIG. 18 is a characteristic diagram illustrating the frequency response of the isolation of the directional coupler 1. In FIG. 18, the horizontal axis represents frequency, and the vertical axis represents isolation. FIG. 19 is a characteristic diagram illustrating the frequency response of the return loss at the coupling port 13 of the directional coupler 1. In FIG. 19, the horizontal axis represents frequency, and the vertical axis represents return loss.

Denoting insertion loss as −x (dB), FIG. 16 indicates that the directional coupler 1 shows a sufficiently small value of x, i.e., 0.2 or below, in a frequency band of 500 to 4000 MHz.

As shown in FIG. 17, the frequency response of the coupling of the directional coupler 1 has two attenuation poles at two frequencies, i.e., at approximately 2600 MHz and approximately 4200 MHz. The two frequencies at which the two attenuation poles occur correspond to the first and second frequencies mentioned previously. When compared with the frequency response of the coupling of the directional coupler 101 of the comparative example shown in FIG. 13, the frequency response of the coupling of the directional coupler 1 shows a reduced change in coupling in response to a change in frequency over a wider frequency band. Denoting coupling as −c (dB), the frequency band in which the value of c is 20 or above is approximately 500 MHz to approximately 3000 MHz for the directional coupler 101 of the comparative example, whereas for the directional coupler 1 according to the first embodiment, it is approximately 500 MHz to approximately 4700 MHz.

Denoting isolation as −i (dB), FIG. 18 indicates that the directional coupler 1 shows a sufficiently large value of i, i.e., 40 or above, in the frequency band of 500 to 4000 MHz.

Denoting return loss at the coupling port 13 as −r (dB), FIG. 19 indicates that the directional coupler 1 shows a sufficiently large value of r, i.e., 15 or above, in the frequency band of 500 to 4000 MHz. This means that the reflection coefficient as viewed in the direction from the coupling port 13 to the terminal port 14 has an absolute value of zero or near zero in the frequency band of 500 to 4000 MHz.

The directional coupler 1 having the characteristics illustrated in FIG. 16 to FIG. 19 is usable in a wide frequency band of at least 500 to 4000 MHz.

As has been described, the directional coupler 1 according to the first embodiment achieves such a frequency response of the coupling that a change in coupling in response to a change in frequency is reduced over a wider frequency band when compared with a frequency response of a coupling in which one attenuation pole occurs. As a result, the directional coupler 1 is usable in a wider band. The directional coupler 1 according to the first embodiment is usable for multiple signals in multiple frequency bands used in CA, for example.

The second inductor L2A in the first matching section 30A and the second inductor L2B in the second matching section 30B both have an inductance of 0.1 nH or higher. Typically, in a stack that is used to form an electronic component and includes a plurality of stacked dielectric layers and conductor layers, any conductor layer connected to the ground has a stray inductance lower than 0.1 nH. The inductance of each of the second inductors L2A and L2B, which is 0.1 nH or higher, is thus clearly distinguishable from the stray inductance.

Second Embodiment

Figure 20:
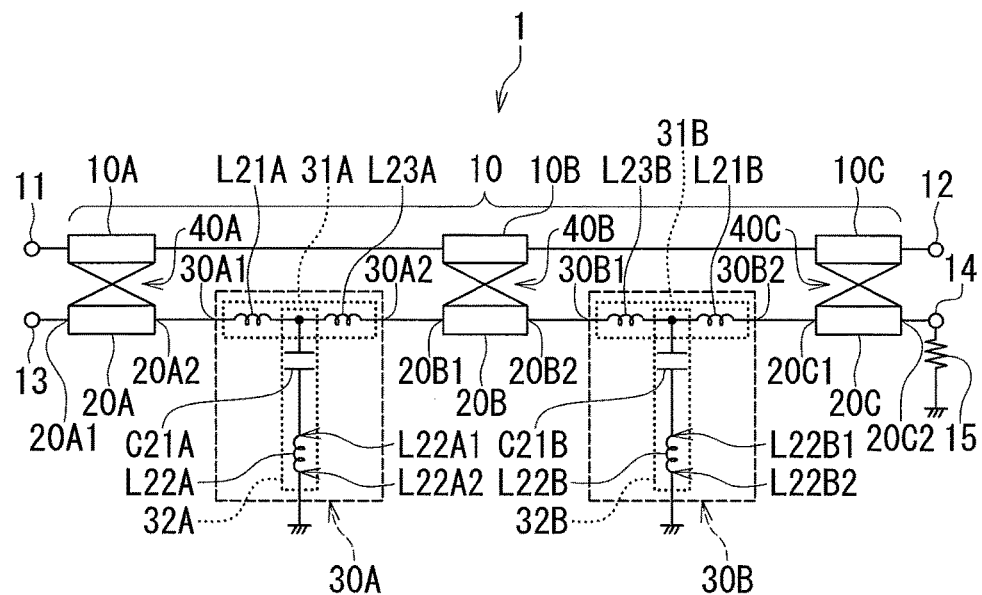
FIG. 20 is a circuit diagram illustrating the circuitry of a directional coupler according to a second embodiment of the invention.

A directional coupler 1 according to a second embodiment of the invention will now be described with reference to FIG. 20. FIG. 20 is a circuit diagram illustrating the circuitry of the directional coupler 1 according to the second embodiment. In the directional coupler 1 according to the second embodiment, the first and second matching sections 30A and 30B are configured differently than the first embodiment.

The first matching section 30A in the second embodiment includes a first path 31A connecting the first end 30A1 and the second end 30A2, and a second path 32A connecting the first path 31A and the ground, as in the first embodiment. The first path 31A includes a first inductor L21A, and a third inductor L23A connected to the first inductor L21A in series.

FIG. 20 illustrates an example in which one end of the first inductor L21A is connected to the second end 20A2 of the first subline section 20A, one end of the third inductor L23A is connected to the first end 20B1 of the second subline section 20B, and the respective other ends of the first inductor L21A and the third inductor L23A are connected to each other. In the second embodiment, however, the locations of the first inductor L21A and the third inductor L23A may be opposite to those in the example shown in FIG. 20.

The second path 32A includes a first capacitor C21A and a second inductor L22A connected in series. The second inductor L22A has a first end L22A1 and a second end L22A2. In terms of circuitry, the first end L22A1 is closest to the first path 31A, and the second end L22A2 is closest to the ground. The first capacitor C21A is provided between the first end L22A1 of the second inductor L22A and the connection point between the first inductor L21A and the third inductor L23A. The second inductor L22A has an inductance of 0.1 nH or higher. The inductance of the second inductor L22A is preferably not higher than 7 nH.

The second matching section 30B in the second embodiment includes a first path 31B connecting the first end 30B1 and the second end 30B2, and a second path 32B connecting the first path 31B and the ground, as in the first embodiment. The first path 31B includes a first inductor L21B, and a third inductor L23B connected to the first inductor L21B in series.

FIG. 20 illustrates an example in which one end of the first inductor L21B is connected to the first end 20C1 of the third subline section 20C, one end of the third inductor L23B is connected to the second end 20B2 of the second subline section 20B, and the respective other ends of the first inductor L21B and the third inductor L23B are connected to each other. In the second embodiment, however, the locations of the first inductor L21B and the third inductor L23B may be opposite to those in the example shown in FIG. 20.

The second path 32B includes a first capacitor C21B and a second inductor L22B connected in series. The second inductor L22B has a first end L22B1 and a second end L22B2. In terms of circuitry, the first end L22B1 is closest to the first path 31B, and the second end L22B2 is closest to the ground. The first capacitor C21B is provided between the first end L22B1 of the second inductor L22B and the connection point between the first inductor L21B and the third inductor L23B. The second inductor L22B has an inductance of 0.1 nH or higher. The inductance of the second inductor L22B is preferably not higher than 7 nH.

The first and second matching sections 30A and 30B of the second embodiment have functions similar to those of the first and second matching sections 30A and 30B of the first embodiment. As in the first embodiment, the first matching section 30A and the second matching section 30B have mutually different characteristics. The remainder of configuration, operation and effects of the second embodiment are similar to those of the first embodiment.

Third Embodiment

Figure 21:
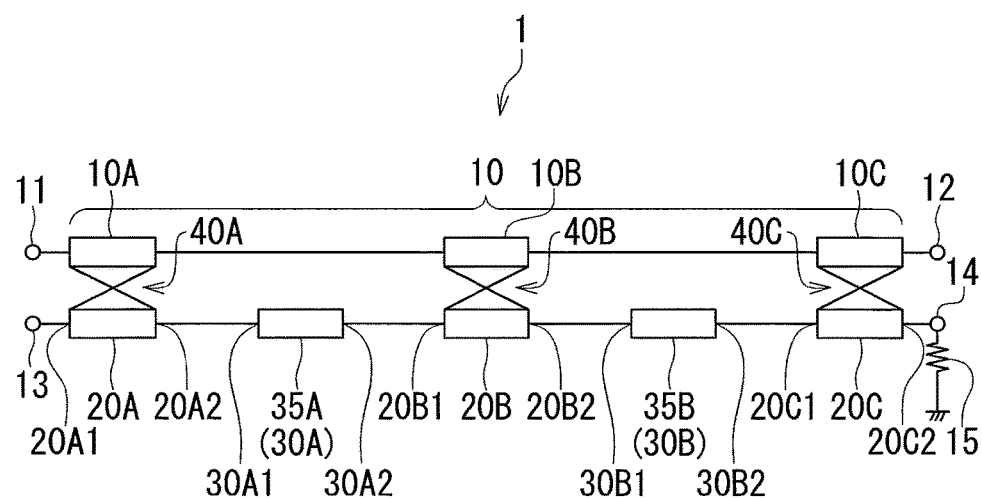
FIG. 21 is a circuit diagram illustrating the circuitry of a directional coupler according to a third embodiment of the invention.

A directional coupler 1 according to a third embodiment of the invention will now be described with reference to FIG. 21. FIG. 21 is a circuit diagram illustrating the circuitry of the directional coupler 1 according to the third embodiment. In the directional coupler 1 according to the third embodiment, each of the first and second matching sections 30A and 30B is formed of a line, without using any inductor or capacitor. The line forming the first matching section 30A will be referred to as the first line and denoted by reference symbol 35A. The line forming the second matching section 30B will be referred to as the second line and denoted by reference symbol 35B.

The first line 35A and the second line 35B have functions similar to those of the first matching section 30A and the second matching section 30B of the first embodiment. Specifically, the first line 35A and the second line 35B are configured to cause changes in phase of high frequency signals passing therethrough, and have mutually different characteristics so that first and second attenuation poles occur at first and second frequencies different from each other in the frequency response of the coupling of the directional coupler 1. The first line 35A causes a phase change of 180° or around 180°, specifically in the range of 135° to 225°, in a signal having the first frequency at which the first attenuation pole occurs. The second line 35B causes a phase change of 180° or around 180°, specifically in the range of 135° to 225°, in a signal having the second frequency at which the second attenuation pole occurs. The mutually different characteristics of the first and second lines 35A and 35B are achieved by making the lengths of the first and second lines 35A and 35B different from each other.

Figure 22:
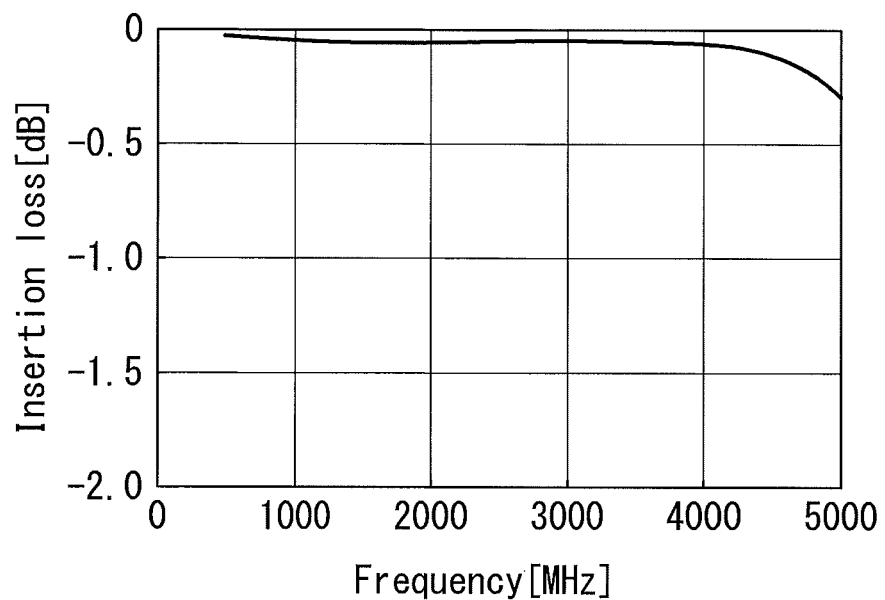
FIG. 22 is a characteristic diagram illustrating the frequency response of the insertion loss of the directional coupler according to the third embodiment of the invention.
Figure 23:
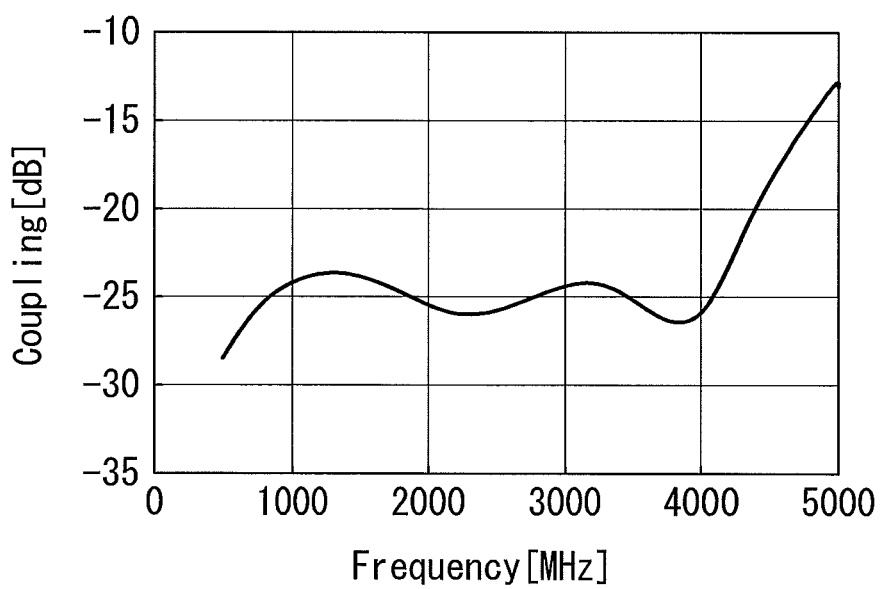
FIG. 23 is a characteristic diagram illustrating the frequency response of the coupling of the directional coupler according to the third embodiment of the invention.
Figure 24:
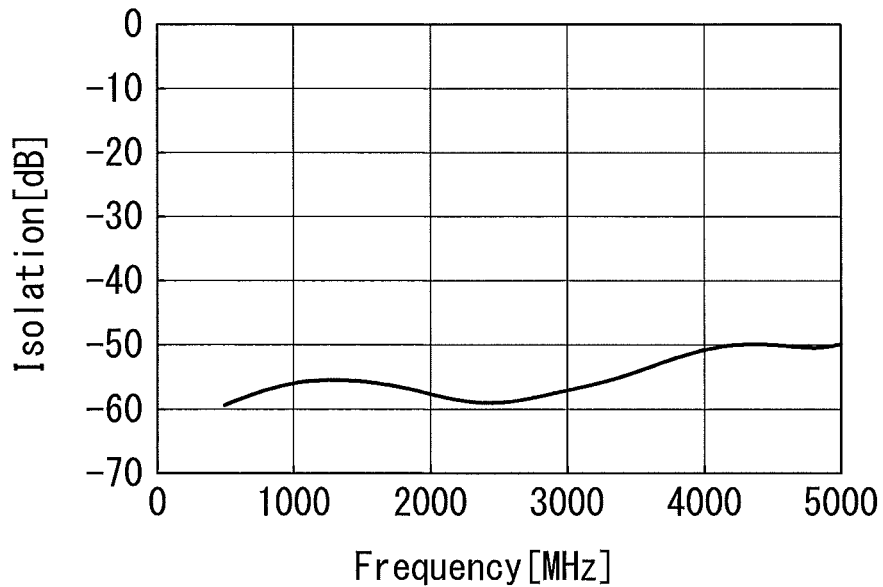
FIG. 24 is a characteristic diagram illustrating the frequency response of the isolation of the directional coupler according to the third embodiment of the invention.
Figure 25:
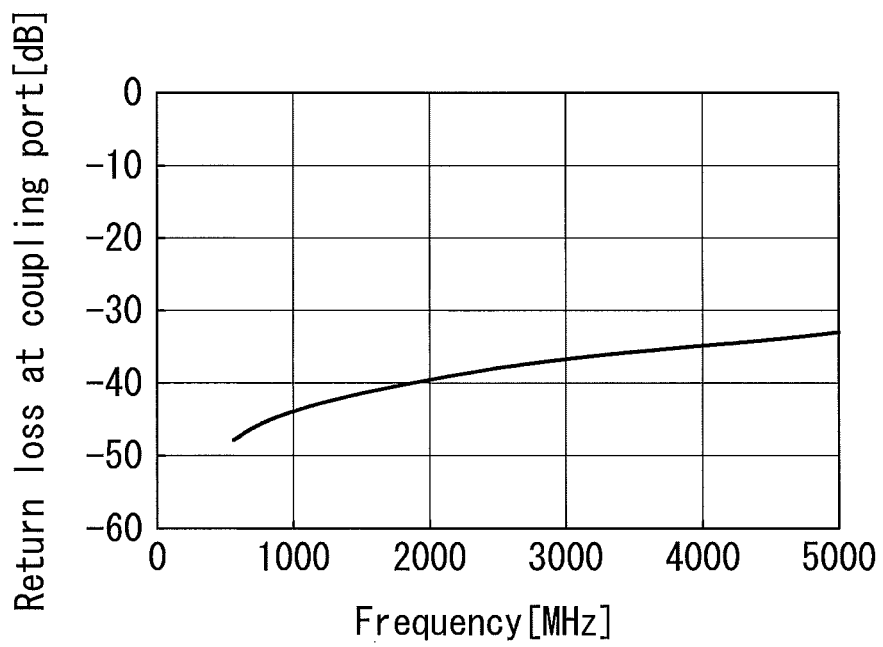
FIG. 25 is a characteristic diagram illustrating the frequency response of the return loss at the coupling port of the directional coupler according to the third embodiment of the invention.

An example of characteristics of the directional coupler 1 according to the third embodiment will now be described with reference to FIG. 22 to FIG. 25. FIG. 22 is a characteristic diagram illustrating the frequency response of the insertion loss of the directional coupler 1. In FIG. 22, the horizontal axis represents frequency, and the vertical axis represents insertion loss. FIG. 23 is a characteristic diagram illustrating the frequency response of the coupling of the directional coupler 1. In FIG. 23, the horizontal axis represents frequency, and the vertical axis represents coupling. FIG. 24 is a characteristic diagram illustrating the frequency response of the isolation of the directional coupler 1. In FIG. 24, the horizontal axis represents frequency, and the vertical axis represents isolation. FIG. 25 is a characteristic diagram illustrating the frequency response of the return loss at the coupling port 13 of the directional coupler 1. In FIG. 25, the horizontal axis represents frequency, and the vertical axis represents return loss.

Denoting insertion loss as −x (dB), FIG. 22 indicates that the directional coupler 1 according to the third embodiment shows a sufficiently small value of x, i.e., 0.2 or below, in the frequency band of 500 to 4000 MHz.

As shown in FIG. 23, the frequency response of the coupling of the directional coupler 1 according to the third embodiment has two attenuation poles at two frequencies, i.e., at approximately 2300 MHz and approximately 3800 MHz. The two frequencies at which the two attenuation poles occur correspond to the first and second frequencies described in relation to the first embodiment. When compared with the frequency response of the coupling of the directional coupler 101 of the comparative example shown in FIG. 13, the frequency response of the coupling of the directional coupler 1 according to the third embodiment shows a reduced change in coupling in response to a change in frequency over a wider frequency band. Denoting coupling as −c (dB), the frequency band in which the value of c is 20 or above is approximately 500 MHz to approximately 3000 MHz for the directional coupler 101 of the comparative example, whereas for the directional coupler 1 according to the third embodiment, it is approximately 500 MHz to approximately 4300 MHz.

Denoting isolation as −i (dB), FIG. 24 indicates that the directional coupler 1 according to the third embodiment shows a sufficiently large value of i, i.e., 50 or above, in the frequency band of 500 to 4000 MHz.

Denoting return loss at the coupling port 13 as −r (dB), FIG. 25 indicates that the directional coupler 1 according to the third embodiment shows a sufficiently large value of r, i.e., 30 or above, in a frequency band of 500 to 5000 MHz. This means that the reflection coefficient as viewed in the direction from the coupling port 13 to the terminal port 14 has an absolute value of zero or near zero in the frequency band of 500 to 5000 MHz.

The directional coupler 1 according to the third embodiment having the characteristics illustrated in FIG. 22 to FIG. 25 is usable in a wide frequency band of at least 500 to 4000 MHz.

The remainder of configuration, operation and effects of the third embodiment are similar to those of the first embodiment.

The present invention is not limited to the foregoing embodiments, and various modifications may be made thereto. For example, the configuration of each of the first and second matching sections of the present invention is not limited to that illustrated in each embodiment, and can be modified in various ways as far as the requirements of the appended claims are met.

Obviously, many modifications and variations of the present invention are possible in the light of the above teachings. Thus, it is to be understood that, within the scope of the appended claims and equivalents thereof, the invention may be practiced in other than the foregoing most preferable embodiments.

What is claimed is:

1. A directional coupler comprising:
an input port;
an output port;
a coupling port;
a terminal port;
a main line connecting the input port and the output port;
a first subline section, a second subline section and a third subline section each of which is formed of a line configured to be electromagnetically coupled to the main line;
a first matching section; and
a second matching section, wherein
the first to third subline sections and the first and second matching sections each have a first end and a second end opposite to each other,
the first end of the first subline section is connected to the coupling port,
the first end of the first matching section is connected to the second end of the first subline section,
the first end of the second subline section is connected to the second end of the first matching section,
the first end of the second matching section is connected to the second end of the second subline section,
the first end of the third subline section is connected to the second end of the second matching section,
the second end of the third subline section is connected to the terminal port, and
the first matching section and the second matching section are configured to cause changes in phase of high frequency signals passing therethrough, and have mutually different characteristics so as to create two attenuation poles in a frequency response of a coupling of the directional coupler.

2. The directional coupler according to claim 1, wherein a strength of coupling of the second subline section to the main line is higher than a strength of coupling of the first subline section to the main line and a strength of coupling of the third subline section to the main line.

3. The directional coupler according to claim 1, wherein
each of the first and second matching sections includes a first path connecting the first end and the second end of the matching section, and a second path connecting the first path and a ground,
the first path includes a first inductor, and
the second path includes a first capacitor and a second inductor connected in series.

4. The directional coupler according to claim 3, wherein
the first inductor has a first end and a second end opposite to each other,
the second inductor has a first end and a second end, the first end being closest to the first path in terms of circuitry, the second end being closest to the ground in terms of circuitry,
the first capacitor is provided between the first end of the first inductor and the first end of the second inductor, and
the second path further includes a second capacitor provided between the second end of the first inductor and the first end of the second inductor.

5. The directional coupler according to claim 3, wherein
the first path further includes a third inductor connected to the first inductor in series,
the second inductor has a first end and a second end, the first end being closest to the first path in terms of circuitry, the second end being closest to the ground in terms of circuitry, and
the first capacitor is provided between the first end of the second inductor and a connection point between the first inductor and the third inductor.

6. The directional coupler according to claim 3, wherein the second inductor has an inductance of 0.1 nH or higher.

7. The directional coupler according to claim 1, wherein each of the first matching section and the second matching section is a line.

* * * * *